United States Patent
Park et al.

(10) Patent No.: US 11,133,355 B2
(45) Date of Patent: Sep. 28, 2021

(54) INPUT SENSOR AND DISPLAY DEVICE HAVING THE SAME

(71) Applicant: SAMSUNG DISPLAY CO., LTD., Yongin-si (KR)

(72) Inventors: Jongseon Park, Wonju-si (KR); Hwan-Hee Jeong, Cheonan-si (KR); Sunhwa Kim, Cheonan-si (KR); Won-Il Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/869,134

(22) Filed: May 7, 2020

(65) Prior Publication Data
US 2020/0357857 A1 Nov. 12, 2020

(30) Foreign Application Priority Data
May 10, 2019 (KR) .................. 10-2019-0054680

(51) Int. Cl.
*H01L 27/32* (2006.01)
*G06F 3/041* (2006.01)
*G06F 3/047* (2006.01)

(52) U.S. Cl.
CPC ............ *H01L 27/323* (2013.01); *G06F 3/047* (2013.01); *G06F 3/0412* (2013.01); *G06F 2203/04111* (2013.01); *G06F 2203/04112* (2013.01)

(58) Field of Classification Search
CPC .... G06F 3/0412; G06F 3/0445; G06F 3/0446; G06F 3/047; G06F 2203/04102;
(Continued)

(56) References Cited

U.S. PATENT DOCUMENTS

2007/0188757 A1 8/2007 Amsden et al.
2016/0048248 A1* 2/2016 Na .................. G06F 3/047
345/174
(Continued)

FOREIGN PATENT DOCUMENTS

CN 108089748 5/2018
GB 2565404 2/2019
(Continued)

OTHER PUBLICATIONS

European Search Report dated Sep. 25, 2020 in corresponding European Patent Application No. 20173651.9 (12 pages).

*Primary Examiner* — Nelson M Rosario
(74) *Attorney, Agent, or Firm* — F. Chau & Associates, LLC

(57) ABSTRACT

An input sensor includes a first pattern and a second pattern overlapping with the first pattern with an intermediate insulating layer interposed therebetween. The second pattern is disposed on the intermediate insulating layer and connected to the first pattern via a contact hole defined through the intermediate insulating layer. The first pattern includes a first mesh line extending along a reference direction, and the second pattern includes a second mesh line extending along the reference direction and overlapping with the first mesh line. An edge of the first mesh line and an edge of the second mesh line are not aligned with each other along a direction perpendicular to a line width direction and the reference direction.

21 Claims, 23 Drawing Sheets

(58) Field of Classification Search
CPC . G06F 2203/04111; G06F 2203/04112; H01L 27/323
See application file for complete search history.

(56) References Cited

U.S. PATENT DOCUMENTS

| | | |
|---|---|---|
| 2016/0103517 A1 | 4/2016 | Kang et al. |
| 2017/0364171 A1 | 12/2017 | You et al. |
| 2018/0032188 A1 | 2/2018 | Park et al. |
| 2018/0061893 A1 | 3/2018 | Breedlove et al. |
| 2018/0232090 A1 | 8/2018 | Yoon et al. |
| 2018/0286925 A1 | 10/2018 | Kim et al. |

FOREIGN PATENT DOCUMENTS

| | | |
|---|---|---|
| KR | 10-2007-0106603 | 11/2007 |
| KR | 10-2016-0094813 | 8/2016 |
| KR | 10-2018-0094596 | 8/2018 |
| KR | 10-2018-0112165 | 10/2018 |
| KR | 10-1913395 | 10/2018 |

* cited by examiner

INPUT SENSOR AND DISPLAY DEVICE HAVING THE SAME

CROSS-REFERENCE TO RELATED APPLICATION

This U.S. non-provisional patent application claims priority under 35 U.S.C. § 119 to Korean Patent Application No. 10-2019-0054680, filed on May 10, 2019, in the Korean Intellectual Property Office, the contents of which are incorporated by reference herein in their entirety.

TECHNICAL FIELD

The present disclosure relates to an input sensor and a display device having the same, and more particularly, to an input sensor having a sensing electrode with a mesh shape and a display device having the same.

DISCUSSION OF RELATED ART

Various display devices applied to multimedia devices, such as televisions, mobile phones, tablet computers, navigation devices, and game devices, are being developed. The display devices include a keyboard, a mouse, or a remote controller as their input device. In addition, the display devices may include a display panel that displays an image and a touch panel (or an input sensing layer) that functions as an input device and generates an input signal when a user touches the touch panel.

In recent years, a bent display device, a curved display device, a foldable display device, and a rollable display device are being developed. When any of these devices is bent, a stress may be applied to the bent portion, and may cause cracking at certain weak point(s) within the device, for example, at a stress concentrated area in the touch panel within the device, thereby creating various defects in the device.

SUMMARY

The present disclosure provides an input sensor capable of preventing an insulating layer from being damaged.

The present disclosure provides a display device having the input sensor.

An exemplary embodiment of the present disclosure provides a display device including a display panel providing a base surface and an input sensor disposed on the base surface. The input sensor includes an intermediate insulating layer, a first sensing electrode, and a second sensing electrode insulated from the first sensing electrode while crossing the first sensing electrode. The first sensing electrode includes a first pattern including mesh lines and a second pattern including mesh lines. The second pattern overlaps with the first pattern with the intermediate insulating layer interposed therebetween and is connected to the first pattern via a contact hole defined through the intermediate insulating layer. The mesh lines of the first pattern include a first mesh line extending in a reference direction, the mesh lines of the second pattern include a second mesh line extending in the reference direction and overlapping with the first mesh line. An edge of the first mesh line and an edge of the second mesh line are not aligned with each other in a direction normal to the base surface.

A distance between the edge of the first mesh line and the edge of the second mesh line in the reference direction is in a range from about 1.5 μm to about 5 μm.

A distance between the edge of the first mesh line and the edge of the second mesh line in the reference direction is greater than a distance between the edge of the first mesh line and the edge of the second mesh line in a line width direction perpendicular to the reference direction.

A line width of the first mesh line and a line width of the second mesh line are substantially the same as each other.

The second sensing electrode includes a third pattern including mesh lines, disposed on a layer the same as that of the first pattern, and spaced apart from the first pattern and a fourth pattern disposed on a layer the same as that of the second pattern, spaced apart from the second pattern, overlapping with the third pattern, connected to the third pattern via a contact hole defined through the intermediate insulating layer, and including mesh lines.

The first pattern includes first sensor areas and a first bridge area connecting the first sensor areas, and the second pattern includes second sensor areas overlapping with the first sensor areas.

The third pattern includes third sensor areas and a dummy area spaced apart from the third sensor areas. The fourth pattern includes fourth sensor areas overlapping with the third sensor areas and the first bridge area, and a second bridge area connecting the fourth sensor areas and overlapping with the dummy area. A direction in which the first sensor areas are arranged is the same as a direction in which the second sensor areas are arranged, a direction in which the third sensor areas are arranged is to the same as a direction in which the fourth sensor areas are arranged, and the direction in which the first sensor areas are arranged crosses the direction in which the third sensor areas are arranged.

The fourth sensor areas have a size greater than a size of the third sensor areas.

The mesh lines of the third pattern include a third mesh line extending along the reference direction. A distance between the edge of the first mesh line and an edge of the third mesh line in the reference direction is in a range from about 1 μm to about 5 μm or in a range from about 6 μm to about 15 μm.

The intermediate insulating layer includes a silicon oxide layer, a silicon nitride layer, or a silicon oxynitride layer.

The input sensor is directly disposed on the base surface.

The input sensor further includes a lower insulating layer disposed under the intermediate insulating layer and supporting the first pattern, and an upper insulating layer covering the second pattern and disposed on the intermediate insulating layer. The lower insulating layer and the intermediate insulating layer each includes an inorganic layer, and the upper insulating layer includes an organic layer.

An exemplary embodiment of the present disclosure provides an input sensor including a first mesh pattern, an insulating layer covering the first mesh pattern, and a second mesh pattern disposed on the insulating layer. The first mesh pattern includes a first sensing area and a second sensing area, which are separated from each other when viewed in a plan view. The second mesh pattern includes a third sensing area and a fourth sensing area, which are separated from each other when viewed in the plan view. Mesh lines arranged in the first sensing area overlap with mesh lines arranged in the third sensing area, mesh lines arranged in the second sensing area overlap with mesh lines arranged in the fourth sensing area, and a first boundary distance between the mesh lines arranged in the first sensing area and the mesh lines arranged in the second sensing area is different from a second boundary distance between the mesh lines arranged in the third sensing area and the mesh lines arranged in the fourth sensing area.

One of the first boundary distance and the second boundary distance is greater than an other one of the first boundary distance and the second boundary distance by about 3 µm to about 10 µm.

The mesh lines arranged in the first sensing area include a first mesh line extending along a reference direction, the mesh lines arranged in the third sensing area include a second mesh line extending along the reference direction and overlapping with the first mesh line, and an edge of the first mesh line and an edge of the second mesh line are not aligned with each other along a direction perpendicular to a line width direction and the reference direction.

A distance between the edge of the first mesh line and the edge of the second mesh line in the reference direction is in a range from about 1.5 µm to about 5 µm.

A distance between the edge of the first mesh line and the edge of the second mesh line in the reference direction is greater than a distance between the edge of the first mesh line and the edge of the second mesh line in the line width direction perpendicular to the reference direction.

An exemplary embodiment of the present disclosure provides a display device including a display panel and an input sensor disposed on the display panel. The input sensor includes an intermediate insulating layer, a sensing electrode, and a floating electrode disposed inside the sensing electrode. The floating electrode includes a first floating pattern including mesh lines and a second floating pattern overlapping with the first floating pattern with the intermediate insulating layer disposed therebetween and including mesh lines. The mesh lines of the first floating pattern include a first mesh line extending in a reference direction, and the mesh lines of the second floating pattern include a second mesh line extending in the reference direction and overlapping with the first mesh line. An edge of the first mesh line and an edge of the second mesh line are not aligned with each other along a direction perpendicular to a line width direction and the reference direction.

The sensing electrode includes a first pattern including mesh lines and disposed on a layer the same as that of the first floating pattern and a second pattern disposed on a layer the same as that of the second floating pattern, overlapping with the first pattern, connected to the first pattern via a contact hole defined through the intermediate insulating layer, and including mesh lines.

A distance between the edge of the first mesh line and the edge of the second mesh line in the reference direction is greater than a distance between the edge of the first mesh line and the edge of the second mesh line in the line width direction perpendicular to the reference direction.

An exemplary embodiment of the present disclosure provides an input sensor including an intermediate insulating layer, a first sensing electrode, and a second sensing electrode separated from the first sensing electrode along a boundary line and crossing the first sensing electrode. The first sensing electrode includes a first pattern including mesh lines which include a first mesh line extending in a reference direction, and a second pattern overlapping with the first pattern with the intermediate insulating layer interposed therebetween, connected to the first pattern via a contact hole defined through the intermediate insulating layer, and including mesh lines which include a second mesh line extending in the reference direction and overlapping with the first mesh line. The first mesh line and the second mesh line together form a step structure or an overhang structure in the reference direction around the boundary line.

A length of a step portion of the first mesh line not overlapping the second mesh line measured in the reference direction or a length of an overhang portion of the second mesh line not overlapping the first mesh line measured in the reference direction is in a range from about 1.5 µm to about 5 µm, and is larger than a range of a normal process error.

According to the above, the combined resistance of the sensing electrode is reduced due to its two-layer structure, and thus the sensitivity may be enhanced. As the sensing electrode has the two-layer structure as a whole, optical characteristics may be enhanced.

Since the edge of the mesh line of the first pattern is not aligned with the edge of the mesh line of the second pattern, the stress applied to the insulating layer in the bending area of the input sensor is reduced. Thus, the insulating layer is prevented from being damaged.

BRIEF DESCRIPTION OF THE DRAWINGS

These and other aspects of the present disclosure will become readily apparent from the following detailed description taken in conjunction with the accompanying drawings in which.

Figure 1:
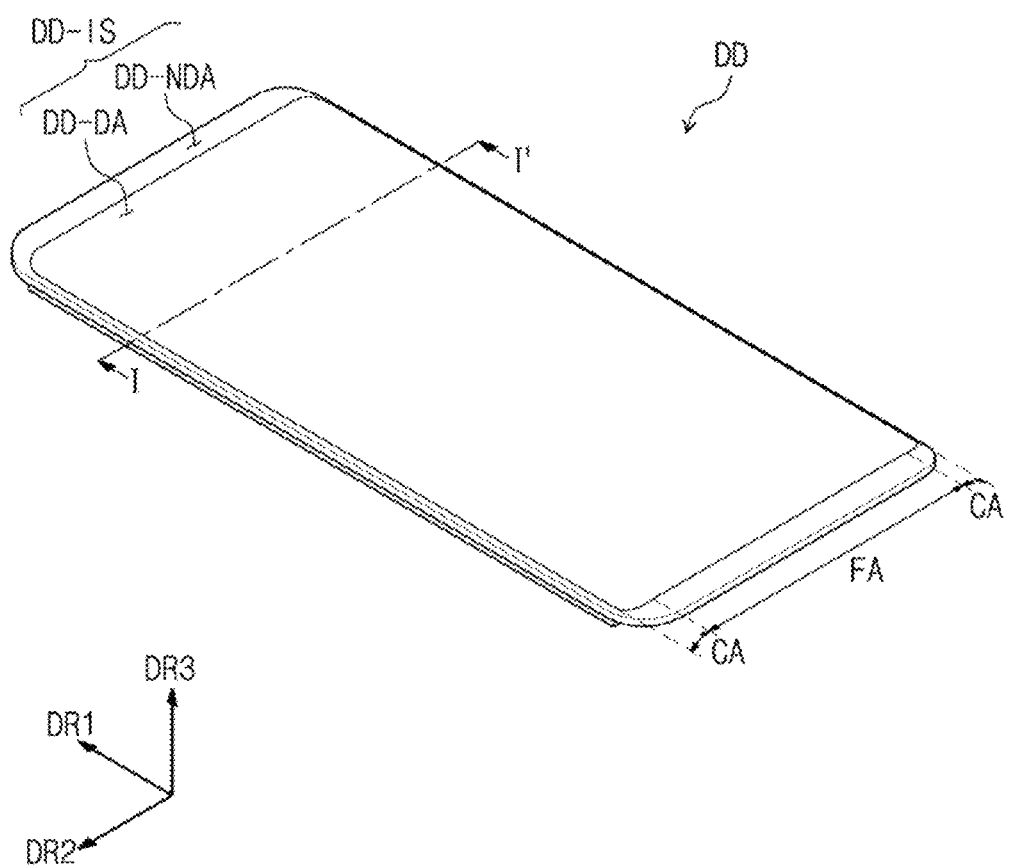
FIG. 1 is a perspective view illustrating a display device according to an exemplary embodiment of the present disclosure.

Since the drawings in FIGS. 1-8C are intended for illustrative purposes, the elements in the drawings are not necessarily drawn to scale. For example, some of the elements may be enlarged or exaggerated for clarity purpose.

DETAILED DESCRIPTION OF THE EMBODIMENTS

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. As used herein, the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

As used herein, the singular forms, "a", "an" and "the" are intended to include the plural forms as well, unless the context clearly indicates otherwise. Also, "About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Spatially relative terms, such as "beneath", "below", "lower", "above", "upper" and the like, may be used herein for ease of description to describe one element or feature's relationship to another element(s) or feature(s) as illustrated in the drawings. The terms are described as a relative concept based on a direction shown in the drawing, and it will be understood that these spatially relative terms are intended to encompass different orientations of the device in use or operation, in addition to the orientation illustrated in the drawings.

It will be further understood that the terms "includes" and/or "including", when used in this specification, specify the presence of stated features, integers, steps, operations, elements, components and/or groups, but do not preclude the presence or addition of one or more other features, integers, steps, operations, elements, components, and/or groups.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless clearly defined in the present disclosure.

Hereinafter, exemplary embodiments of the present disclosure will be described with reference to accompanying drawings.

FIG. 1 is a perspective view illustrating a display device DD according to an exemplary embodiment of the present disclosure. As illustrated in FIG. 1, the display device DD displays an image through a display surface DD-IS (or a front surface). The display surface DD-IS includes a display area DD-DA through which the image is displayed, and a non-display area DD-NDA defined adjacent to the display area DD-DA. For example, a photo, an image or a moving image may be displayed through the display area DD-DA, and may not be displayed through the non-display area DD-NDA.

As illustrated in FIG. 1, the non-display area DD-NDA may surround the display area DD-DA. The display area DD-DA of the display device DD may approximately have a quadrangular shape. Four corner portions of the display area DA may have a round shape having a predetermined curvature. However, the present disclosure is not limited thereto. The shape of the display area DD-DA and the shape of the non-display area DD-NDA may be relatively designed.

In an exemplary embodiment of the present disclosure, the non-display area DD-NDA may have an island shape disposed inside the display area DD-DA. The non-display area DD-NDA disposed inside the display area DD-DA may have a size relatively smaller than that of the display area DD-DA and may overlap with a camera module, a photo-sensor, and an infrared sensor. A hole through which an optical signal passes may be defined through the non-display area DD-NDA. The non-display area DD-NDA having an island shape disposed inside the display area DD-DA may be one and may have a circular shape, but the present disclosure is not limited thereto. For example, in an exemplary embodiment of the present disclosure, the number of the non-display area DD-NDA disposed inside the display area DD-DA may be equal to or greater than 2, and/or a shape of each non-display area DD-NDA may be modified in various ways such as, for example, a circular shape, an elliptical shape, a polygonal shape, a star shape, or a diamond shape.

The display surface DD-IS may include a flat area FA and a curved area CA. FIG. 1 illustrates the display surface DD-IS in which the curved area CA is disposed at both sides of the flat area FA as a representative example. The flat area FA is substantially parallel to a surface defined by a first directional axis DR1 and a second directional axis DR2. A third directional axis DR3 indicates a direction normal to the display surface DD-IS, i.e., a thickness direction of the display device DD.

Front (or upper) and rear (or lower) surfaces of each member or each unit described below are distinguished from each other by the third directional axis DR3. However, directions indicated by the first, second, and third directional axes DR1, DR2, and DR3 are merely exemplary. Hereinafter, first, second, and third directions respectively correspond to directions indicated by the first, second, and third directional axes DR1, DR2, and DR3 and are assigned with the same reference numerals as the first, second, and third directional axes DR1, DR2, and DR3.

In the present exemplary embodiment, the display device DD including three areas distinguished from each other are illustrated as a representative example, however, the present disclosure is not limited thereto. The present disclosure may be applied to, for example, a flat rigid display device, a bendable display device, a foldable display device, a rollable display device, or a display device including a three-dimensional display surface (DD-IS) with more than three distinct areas. For example, the three-dimensional display surface (DD-IS), in which images are generated within a display volume rather than upon a stationary surface, may include a plurality of display areas, for example, a polyprism surface. The plurality of display areas may be oriented in different directions.

In the present exemplary embodiment, the display device DD that may be applied to a mobile phone terminal is illustrated as a representative example. An electronic module, a camera module, and a power module, which are mounted on a main board, may be placed on a bracket/a case with the display device DD to form the mobile phone terminal. The display device DD according to an exemplary embodiment of the present disclosure may be applied to large-sized electronic items, such as, for example, a television set and a monitor, and small and medium-sized electronic items, such as, for example, a tablet computer, a car navigation unit, a game unit, and a smart watch.

FIGS. 2A to 2D are cross-sectional views illustrating display devices DD corresponding to cross-sections taken along line I-I' of FIG. 1. FIGS. 2A to 2D illustrate cross sections defined by the second direction DR2 and the third direction DR3. Components of the display device DD are schematically illustrated in FIGS. 2A to 2D to illustrate their stacking relationship.

The display device DD according to an exemplary embodiment of the present disclosure may include a display panel, an input sensor, an anti-reflector, and a window. At least some components of the display panel, the input sensor, the anti-reflector, and the window may be formed through successive processes or may be attached to each other by an adhesive member. FIGS. 2A to 2D illustrate an optically clear adhesive layer (OCA) as a representative example of the adhesive member. The adhesive layer described hereinafter may include a conventional adhesive or pressure sensitive adhesive. The optically clear adhesive layer OCA may be formed from a pre-coated film or from a liquid paste. In general, the optically clear adhesive layer OCA may require optical clarity and may provide shock resistance. In an exemplary embodiment of the present disclosure, the anti-reflector may be replaced with another component or may be omitted.

In FIGS. 2A to 2D, among the input sensor, the anti-reflector, and the window, a component formed through the successive processes with another component is referred to as a "layer". Among the input sensor, the anti-reflector, and the window, a component coupled to another component by the adhesive layer is referred to as a "panel". The panel includes a base layer providing a base surface, e.g., a synthetic resin film, a composite film, or a glass substrate, however, the base layer may be omitted from the component referred to as the "layer". In other words, the component referred to as the "layer" is disposed on the base surface provided by another component.

Hereinafter, the input sensor, the anti-reflector, and the window may be respectively referred to as an "input sensing panel ISP", an "anti-reflective panel RPP", and a "window panel WP" or as an "input sensing layer ISL", an "anti-reflective layer RPL", and a "window layer WL" depending on the presence or absence of the base layer.

As illustrated in FIGS. 2A to 2D, the display device DD may include a non-bending area NBA and a bending area BA respectively corresponding to the flat area FA and the curved area CA illustrated in FIG. 1. For example, referring to FIG. 2A, the bending area BA is a portion adjacent to both sides of the non-bending area NBA, and may be a portion bent downward from the non-bending area NBA. The non-bending area NBA and the bending area BA may be defined equally or differently for each of the display panel, the input sensor, the anti-reflector, and the window.

Figure 2A:
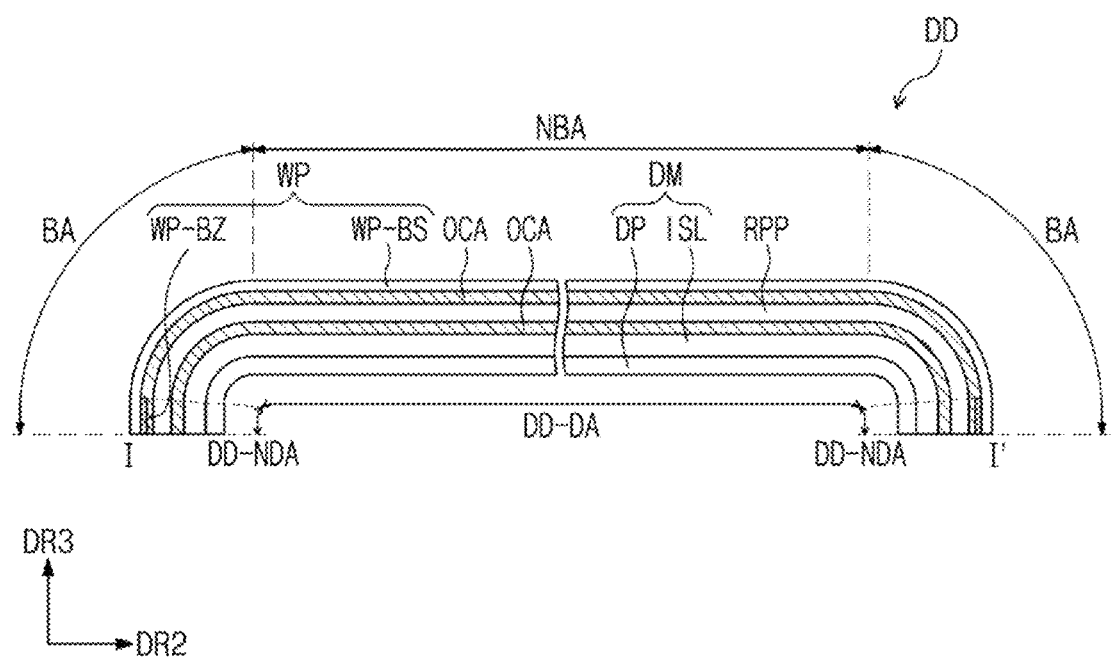
FIGS. 2A to 2D are cross-sectional views illustrating display devices corresponding to cross-sections taken along line I-I' of FIG. 1.

Referring to FIG. 2A, the display device DD may include the display panel DP, the input sensing layer ISL, the anti-reflective panel RPP, and the window panel WP. The input sensing layer ISL is directly disposed on the display panel DP. In the present disclosure, the expression "component "B" is directly disposed on component "A"" means that no intervening elements, such as an adhesive layer/adhesive member, are present between the component "B" and the component "A". The component "B" is formed on a base surface provided by the component "A" through successive processes after the component "A" is formed. For example, the input sensing layer ISL is disposed on the base surface of the display panel DP.

The display panel DP and the input sensing layer ISL directly disposed on the display panel DP are defined as a display module DM. The optically clear adhesive layers OCA are respectively disposed between the display module DM and the anti-reflective panel RPP, and between the anti-reflective panel RPP and the window panel WP.

The display panel DP generates an image, and the input sensing layer ISL obtains coordinate information of an external input (e.g., a touch event). The display module DM according to an exemplary embodiment of the present disclosure may further include a protective member disposed on a lower surface (e.g., a back surface) of the display panel DP. The protective member and the display panel DP are coupled to each other by an adhesive layer. The display devices DD described below with reference to FIGS. 2B to 2D may also further include the protective member.

The display panel DP according to an exemplary embodiment of the present disclosure may be a light emitting type display panel, however, the present disclosure is not limited thereto. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot and/or a quantum rod. The quantum dot and the quantum rod may be small semiconductor particles which are several nanometers in size. Hereinafter, the organic light emitting display panel will be described as a representative example of the display panel DP.

The anti-reflective panel RPP reduces a reflectance of an external light incident thereon from above the window panel WP. The anti-reflective panel RPP according to an exemplary embodiment of the present disclosure may include a retarder and a polarizer. The retarder may be a film type or a liquid crystal coating type and may include a λ/2 retarder and/or a λ/4 retarder. In an exemplary embodiment of the present disclosure, the anti-reflective panel RPP may include two layers of retarder with a first retarder having a λ/2 retardation value, and a second retarder positioned below the first retarder and having a λ/4 retardation value. The polarizer may be a film type or a liquid crystal coating type. The film type polarizer may include a stretching type synthetic resin film, and the liquid crystal coating type polarizer may include liquid crystals arranged in a predetermined arrangement. The film-type polarizer may be a uniaxially stretched film or a biaxially stretched film. The retarder and the polarizer may further include a transparent protective film. For example, the polarizer or the retarder may be interposed between two transparent protective films. The retarder and the polarizer or the transparent protective film may be defined as a base layer of the anti-reflective panel RPP.

The anti-reflective panel RPP according to an exemplary embodiment of the present disclosure may include color filters. The color filters may have a predetermined arrangement. The arrangement of the color filters may be determined by taking into account emission colors of pixels included in the display panel DP. Thus, the desired color may be realized by filtering the light emitted by each of the pixels with the color filter. The anti-reflective panel RPP may further include a black matrix disposed adjacent to the color filters. The anti-reflective panel RPP may further include an insulating layer.

In a case where the pixels of the organic light emitting display panel generate a monochromatic light, the anti-reflective panel RPP may further include a color conversion layer. The color conversion layer may include wavelength converting particles that convert a wavelength of at least a part of incident light. For example, the wavelength converting particle may include a first wavelength converting particle that converts an incident light having a specific wavelength into a light having a first wavelength and emits it, and a second wavelength converting particle that converts an incident light having a specific wavelength into a light having a second wavelength and emits it. The color conversion layer may include the quantum dot and/or the quantum rod. In a case where the organic light emitting display panel generates a blue light, the anti-reflective panel RPP may include a blue color filter, a first color conversion layer converting the blue light to a red light, and a second color conversion layer converting the blue light to a green light.

The anti-reflective panel RPP according to an exemplary embodiment of the present disclosure may include a destructive interference structure. For instance, the destructive interference structure may include a first reflection layer and a second reflection layer located on different layers. A first reflection light and a second reflection light, which are reflected by the first reflection layer and the second reflection layer, respectively, may be destructively interfered with each other, and thus the reflectance of the external light may be reduced.

The window panel WP according to an exemplary embodiment of the present disclosure includes a base film WP-BS and a bezel pattern WP-BZ. The base film WP-BS may include, for example, a glass substrate and/or a synthetic resin film. The base film WP-BS should not be limited to a single-layer structure. For example, the base film WP-BS may include two or more films coupled to each other by an adhesive member.

The bezel pattern WP-BZ partially overlaps with the base film WP-BS. In the present application, the word "overlap" always refers to the overlap of one object with another object in the third direction DR3. The bezel pattern WP-BZ is disposed on a rear surface of the base film WP-BS to define the bezel area, i.e., the non-display area DD-NDA, of the display device DD.

The bezel pattern WP-BZ may be a colored organic layer, and may be formed through a coating process. The bezel pattern WP-BZ may include a plurality of organic layers. Some organic layers may be provided with a predetermined pattern formed therein. The bezel pattern WP-BZ may have a predetermined color. When the base film WP-BS is provided as a glass or plastic substrate, the bezel pattern WP-BZ may be a color layer or color layers printed or deposited on one side of the glass or plastic substrate. In an exemplary embodiment of the present disclosure, the window panel WP may further include a functional coating layer disposed on a front surface of the base film WP-BS. The functional coating layer may include an anti-fingerprint layer, an anti-reflective layer, and a hard coating layer.

Figure 2B:
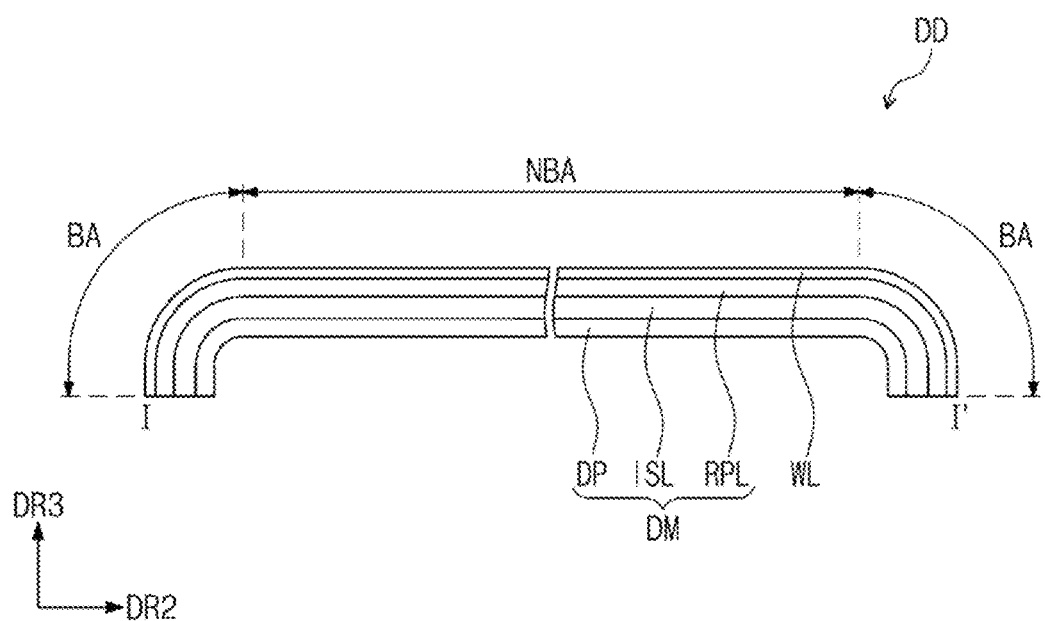
Figure 2C:
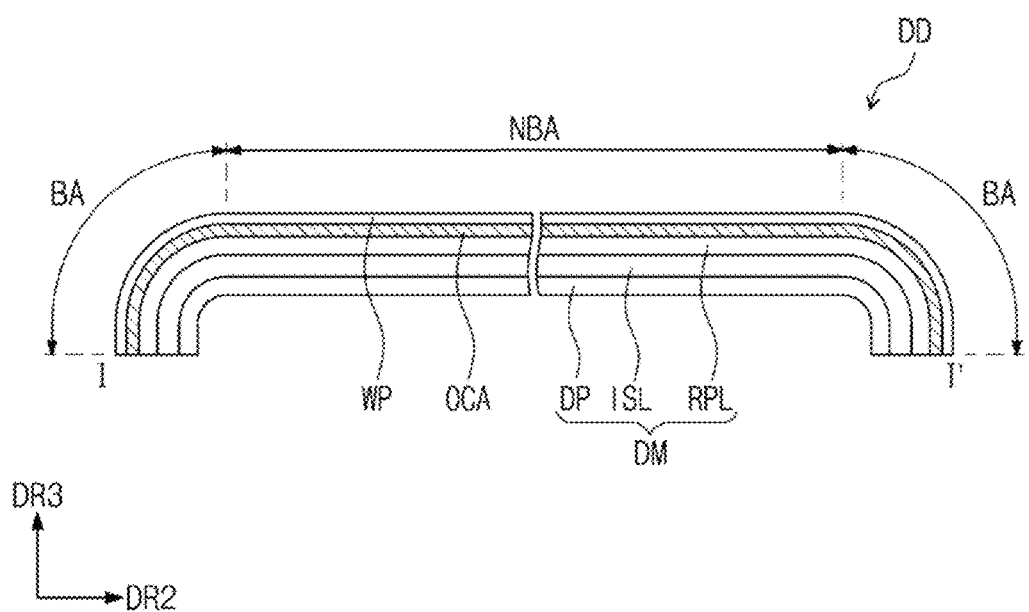
Figure 2D:
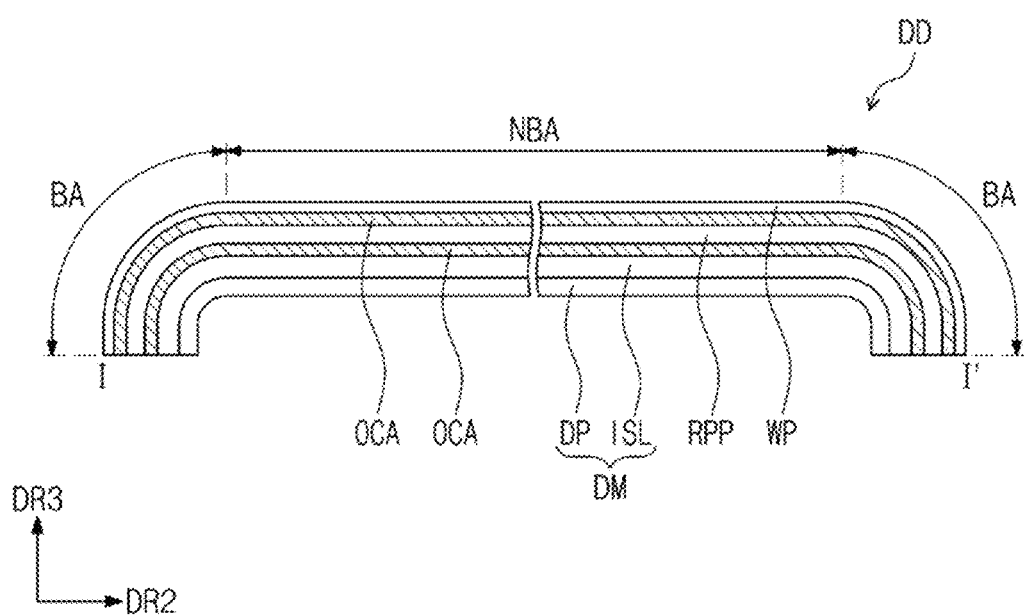

In FIGS. 2B to 2D, the window panel WP and the window layer WL are schematically illustrated without distinction of the base film WP-BS and the bezel pattern WP-BZ.

As illustrated in FIG. 2B, the display device DD may include the display panel DP, the input sensing layer ISL, the anti-reflective layer RPL, and the window layer WL. Adhesive members may be omitted from the display device DD, and the input sensing layer ISL, the anti-reflective layer RPL, and the window layer WL may be formed on a base surface of the display panel DP through successive processes. For example, the window layer WL, the anti-reflective layer RPL, the input sensing layer ISL and the display panel DP may be integrated in a single base substrate within the display device DD. Thus, the thickness of the display device DD may be reduced. The stacked order of the input sensing layer ISL and the anti-reflective layer RPL may be changed. For example, in an exemplary embodiment of the present disclosure, the input sensing layer ISL may be located over the anti-reflective layer RPL and interposed between the window layer WL and the anti-reflective layer RPL.

In an exemplary embodiment of the present disclosure, one of the anti-reflective layer RPL and the window layer WL may be changed to the panel type. As illustrated in FIG. 2C, the window panel WP may be coupled to the anti-reflective layer RPL by an optically clear adhesive layer OCA. As illustrated in FIG. 2D, an optically clear adhesive layer OCA may be further disposed between the anti-reflective panel RPP and the input sensing layer ISL.

In an exemplary embodiment of the present disclosure, the display device DD may include two types of anti-reflectors. For example, the display device DD may include the anti-reflective layer RPL directly disposed on the input sensing layer ISL and may further include the anti-reflective panel RPP coupled to the anti-reflective layer RPL by the optically clear adhesive layer OCA.

In FIGS. 2A to 2D, the input sensing layer ISL and the input sensing panel ISP are illustrated to entirely overlap with the display panel DP, however, the present disclosure is not limited thereto. For example, the input sensing layer ISL and the input sensing panel ISP may overlap with only the display area DD-DA. In an exemplary embodiment of the present disclosure, the input sensing layer ISL and the input sensing panel ISP may overlap with a portion of the display area DD-DA or may overlap with only the non-display area DD-NDA.

Figure 3A:
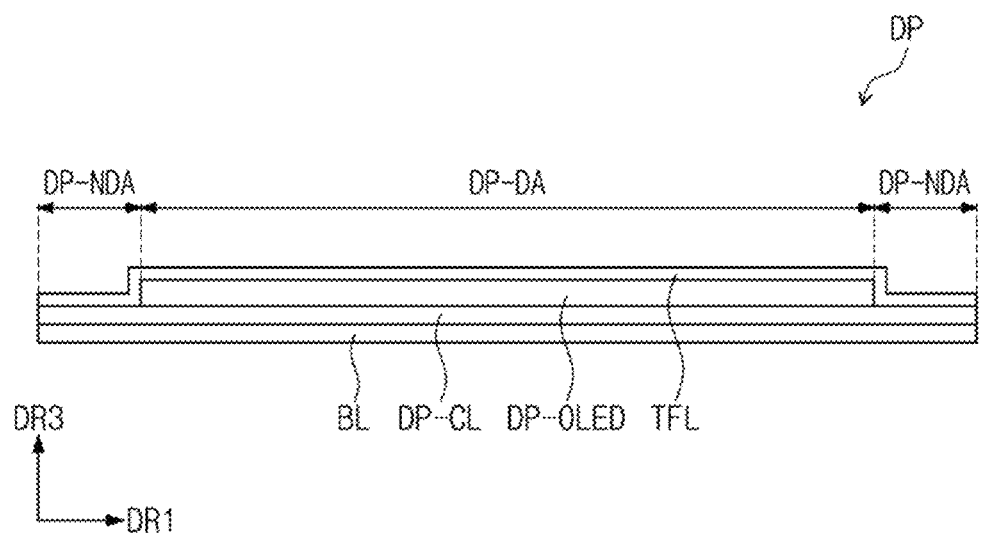
FIGS. 3A and 3B are cross-sectional views illustrating display panels according to an exemplary embodiment of the present disclosure.
Figure 3B:
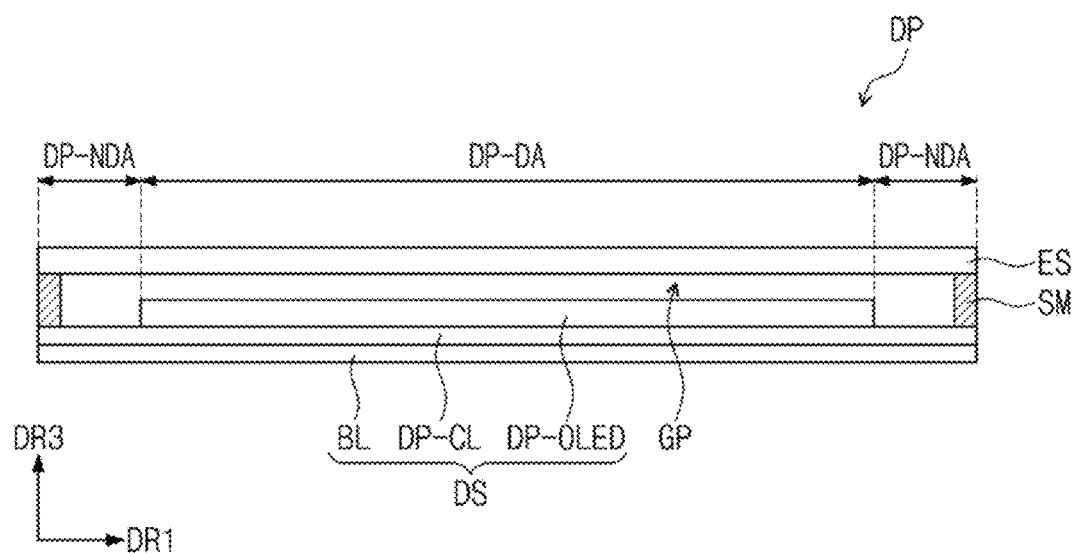
Figure 3C:
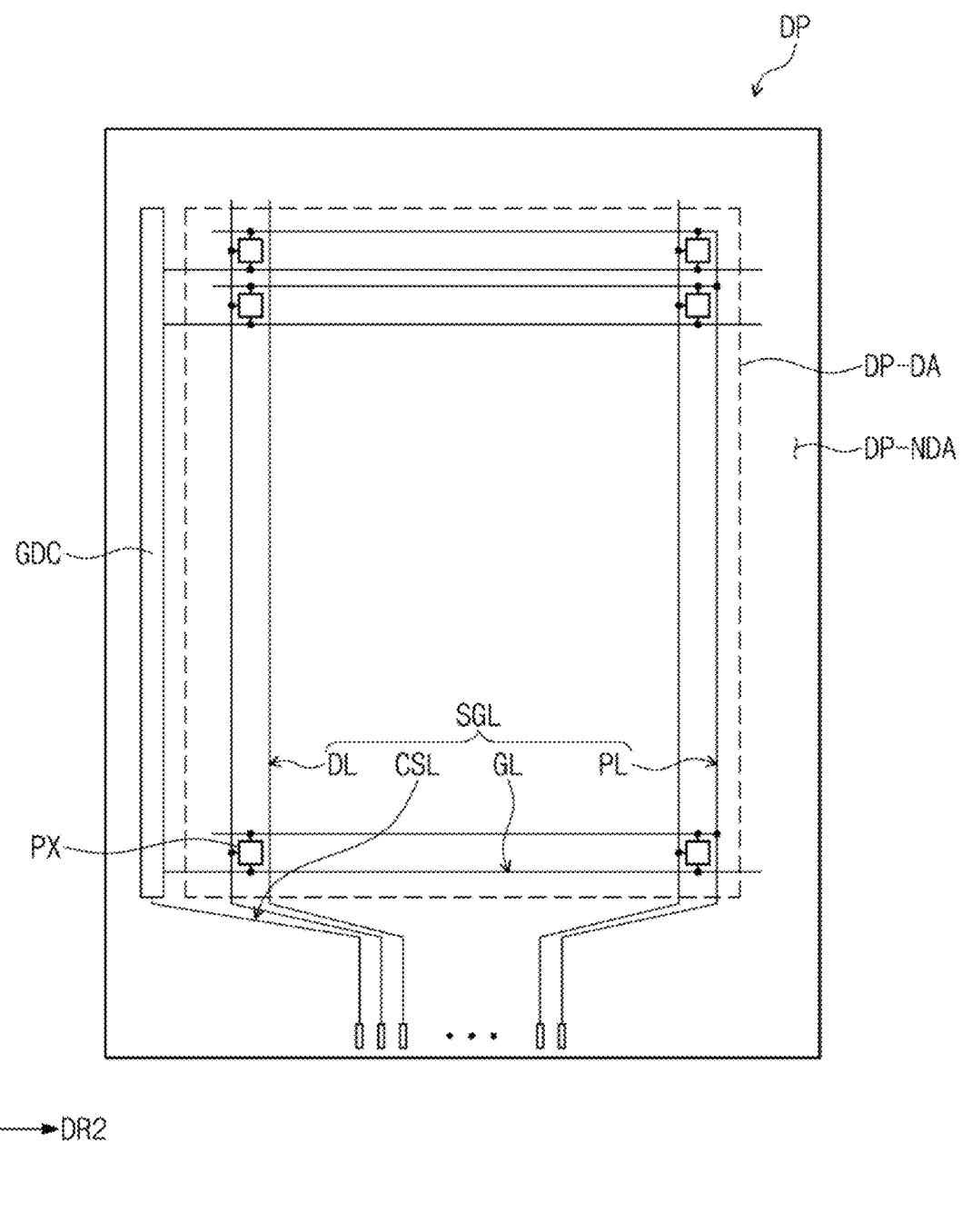
FIG. 3C is a plan view illustrating a display panel according to an exemplary embodiment of the present disclosure.
Figure 3D:
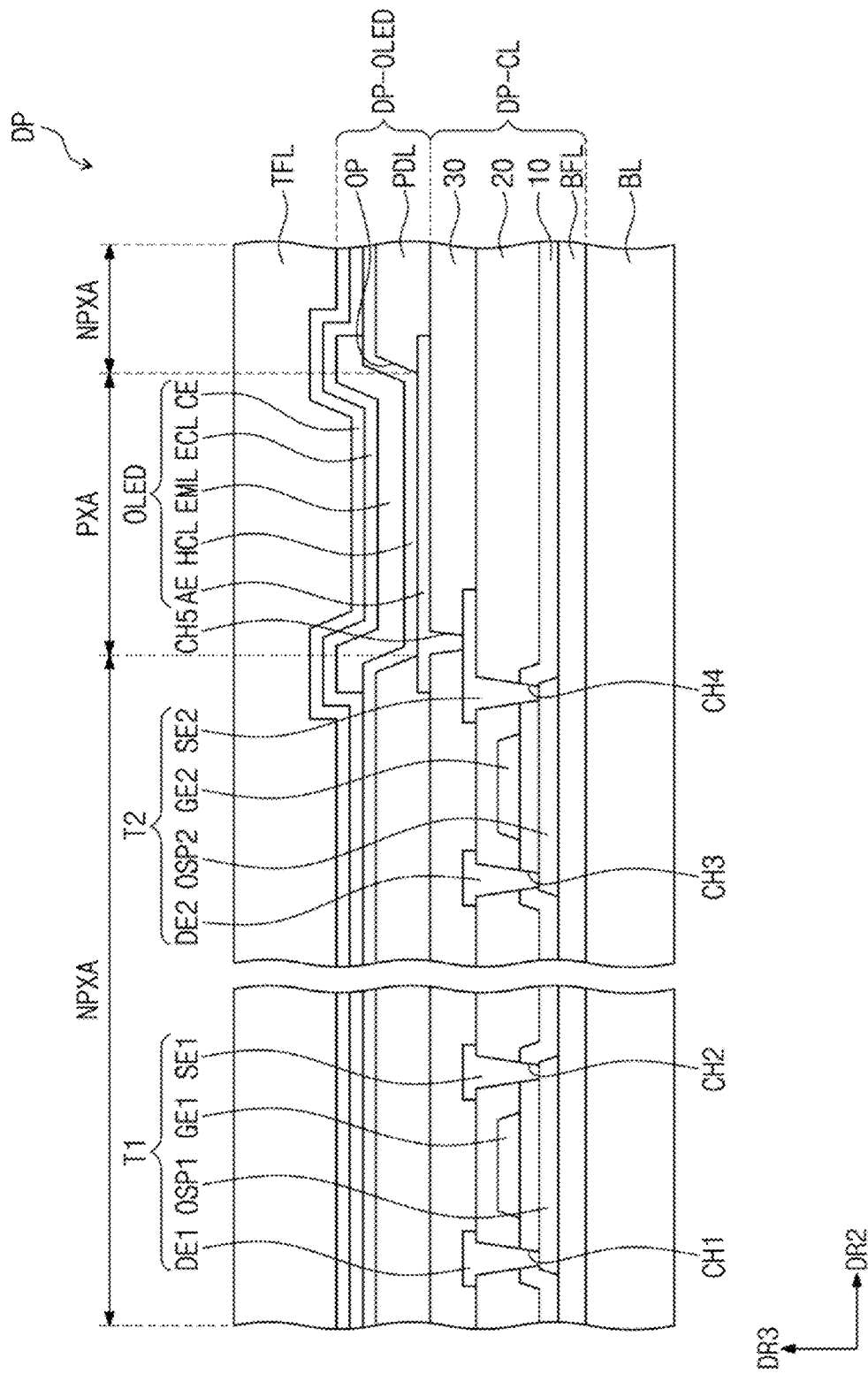
FIG. 3D is an enlarged cross-sectional view illustrating a display panel according to an exemplary embodiment of the present disclosure.

FIGS. 3A and 3B are cross-sectional views illustrating display panels DP according to an exemplary embodiment of the present disclosure. FIG. 3C is a plan view illustrating the display panel DP according to an exemplary embodiment of the present disclosure. FIG. 3D is an enlarged cross-sectional view illustrating the display panel DP according to an exemplary embodiment of the present disclosure. The display panels DP described below with reference to FIGS. 3A to 3D may be applied to the display devices DD described with reference to FIGS. 2A to 2D.

FIGS. 3A and 3B illustrate the cross sections of the display panels DP in a stretched state. As illustrated in FIG. 3A, the display panel DP includes a base layer BL, a circuit element layer DP-CL, a display element layer DP-OLED, and an upper insulating layer TFL, and the circuit element layer DP-CL, the display element layer DP-OLED, and the upper insulating layer TFL are disposed on the base layer BL. A display area DP-DA and a non-display area DP-NDA, which respectively correspond to the display area DD-DA and the non-display area DD-NDA of the display surface DD-IS illustrated in FIG. 1, may be defined in the display panel DP. The display area DP-DA may be an area in which the pixels are arranged. The non-display area DP-NDA may be an area in which the pixels are not arranged and signal lines supporting an operation of the pixels are arranged. Each of the pixels may include a light emitting element, e.g., an organic light emitting diode OLED, as a display element to be described (see FIG. 3D). In the present disclosure, the expression "an area corresponds to an area" means that "areas overlap with each other", but is not limited to that "areas have the same size".

The base layer BL may include at least one plastic film. The base layer BL may include, for example, a plastic substrate, a glass substrate, a metal substrate, or an organic/inorganic composite substrate. In the present exemplary embodiment, the base layer BL may be a thin film glass substrate having a thickness from tens of micrometers to hundreds of micrometers.

The circuit element layer DP-CL includes at least one insulating layer and a circuit element. The insulating layer includes at least one inorganic layer and at least one organic layer. The circuit element includes signal lines and a driving circuit of the pixels. The circuit element layer DP-CL may also include a buffer layer over the base layer BL. Detailed descriptions of the circuit element layer DP-CL will be described later.

The display element layer DP-OLED includes at least organic light emitting diodes OLED. The display element layer DP-OLED may further include an organic layer such as a pixel definition layer.

The upper insulating layer TFL includes a plurality of thin layers. Some layers are disposed to enhance an optical efficiency, and some layers are disposed to protect the organic light emitting diodes OLED. In an example embodiment of the present disclosure, the upper insulating layer TFL may include at least one inorganic layer and at least one organic layer, and may be disposed on the light-emitting element such as the organic light emitting diode OLED to protect the organic light emitting diode OLED.

As illustrated in FIG. 3B, the display panel DP includes a base layer BL, a circuit element layer DP-CL, a display element layer DP-OLED, an encapsulation substrate ES, which are disposed on the base layer BL, and a sealant SM coupling the base layer BL and the encapsulation substrate ES to each other. The encapsulation substrate ES may be spaced apart from the display element layer DP-OLED by a predetermined gap GP, and the gap GP may be maintained by the sealant SM. For example, the combination of the display substrate DS, which includes the base layer BL, the circuit element layer DP-CL and the display element layer DP-OLED, the sealant SM, and the encapsulation substrate ES may form an enclosed space which includes the gap GP. The base layer BL and the encapsulation substrate ES may include, for example, a plastic substrate, a glass substrate, a metal substrate, or an organic/inorganic composite substrate. The sealant SM may include an organic adhesive or frit, or may include both. The frit may include a crystalized (fully and/or partially crystallized) base or mother glass. In an exemplary embodiment of the present disclosure, the sealant SM may include a frit sealing member and an organic sealing member.

As illustrated in FIG. 3C, the display panel DP includes a driving circuit GDC, a plurality of signal lines SGL (hereinafter, referred to as "signal lines"), and a plurality of pixels PX (hereinafter, referred to as "pixels"). Each of the pixels PX includes a light emitting element and a pixel driving circuit connected to the light emitting element. The driving circuit GDC, the signal lines SGL, and the pixel driving circuit may be included in the circuit element layer DP-CL illustrated in FIGS. 3A and 3B.

The driving circuit GDC includes a scan driving circuit. The scan driving circuit generates a plurality of scan signals (hereinafter, referred to as "scan signals") and sequentially outputs the scan signals to a plurality of scan lines GL (hereinafter, referred to as "scan lines") described later. For example, the driving circuit GDC, to which the scan lines GL are connected, may be disposed in the non-display area DP-NDA. The scan driving circuit may further output other control signals to the driving circuit of the pixels PX.

The signal lines SGL include the scan lines GL, data lines DL, a power line PL, and a control signal line CSL. Each of the scan lines GL is connected to a corresponding pixel among the pixels PX, and each of the data lines DL is connected to a corresponding pixel among the pixels PX. The scan lines GL may be spaced apart from each other in the first direction DR1 and extending in the second direction DR2, while the data lines DL may be spaced apart from each other in the second direction DR2 and extending in the first direction DR1. The power line PL is connected to the pixels PX. The control signal line CSL provides the scan driving circuit with control signals. Each of the control signals provided by the control signal line CSL may include a vertical start signal for controlling the operation of the driving circuit GDC and at least one clock signal for determining the output timing of signals.

The signal lines SGL may be connected to a circuit board, and, for example, may be connected to a timing control circuit provided in the form of an integrated chip and mounted on the circuit board. In an exemplary embodiment of the present disclosure, the integrated chip may be disposed in the non-display area DP-NDA and may be connected to the signal lines SGL.

FIG. 3D illustrates a cross section of the display panel DP corresponding to one pixel PX. FIG. 3D illustrates the cross section corresponding to the organic light emitting diode OLED and a first transistor T1 (or a switching transistor) and a second transistor T2 (or a driving transistor), which drive the organic light emitting diode OLED.

The circuit element layer DP-CL includes at least one insulating layer and the circuit element. The circuit element includes the signal lines and the driving circuit of the pixel. The circuit element layer DP-CL may be formed by coating and deposition processes used to form an insulating layer, a semiconductor layer, and a conductive layer and a photolithography process and/or an etching process used to pattern the insulating layer, the semiconductor layer, and the conductive layer.

In the present exemplary embodiment, the circuit element layer DP-CL includes a buffer layer BFL, a first inorganic layer 10, and a second inorganic layer 20. In addition, the circuit element layer DP-CL includes an intermediate organic layer 30. Materials for the inorganic layer and the organic layer should not be particularly limited, and the buffer layer BFL may be selectively disposed or omitted. The buffer layer BFL includes a plurality of inorganic layers stacked one on another.

FIG. 3D illustrates an arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which form the first transistor T1 and the second transistor T2, as a representative example. First to fifth through holes CH1 to CH5 are also illustrated by way of example.

The display element layer DP-OLED includes the light emitting element. The display element layer DP-OLED includes the organic light emitting diode OLED as the light emitting element. The display element layer DP-OLED includes a pixel definition layer PDL. For instance, the pixel definition layer PDL may be an organic layer.

A first electrode AE is disposed on an intermediate organic layer 30, and is connected to the second output electrode SE2 of the second transistor T2 through a fifth through hole CH5 defined through the intermediate organic layer 30. The pixel definition layer PDL is provided with an opening OP defined therethrough. At least a portion of the first electrode AE is exposed through the opening OP of the pixel definition layer PDL. The opening OP of the pixel definition layer PDL is named as a "light emitting opening" to distinguish it from other openings.

The display area DP-DA illustrated in FIGS. 3A to 3C includes a light emitting area PXA and a non-light emitting area NPXA disposed adjacent to the light emitting area PXA as illustrated in FIG. 3D. The non-light emitting area NPXA surrounds the light emitting area PXA, and is configured to prevent light from being emitted therefrom. In the present exemplary embodiment, the light emitting area PXA is defined to correspond to the portion of the first electrode AE exposed through the opening OP.

In the present exemplary embodiment, the light emitting area PXA may overlap with at least one of the first and second transistors T1 and T2. The opening OP may be widened, and the first electrode AE and the light emitting layer EML described later may be widened.

A hole control layer HCL may be commonly disposed on the light emitting area PXA and the non-light emitting area NPXA. A common layer such as the hole control layer HCL may be commonly formed in the pixels PX (refer to FIG. 3C). The hole control layer HCL may include a hole transport layer and may further include a hole injection layer.

The light emitting layer EML may be disposed on the hole control layer HCL, and may be disposed in an area corresponding to the opening OP. For example, the light emitting layer EML may be formed in each of the pixels PX after being divided into plural portions, and may generate a color light corresponding to a pixel. The light emitting layer EML may include an organic material and/or an inorganic material. Some of the pixels PX may generate the red light, some other pixels PX may generate the green light, and some other pixels may generate the blue light. In a case where the pixels PX generate a monochromatic light, the light emitting layer EML may be commonly formed in the pixels PX.

An electron control layer ECL may be disposed on the light emitting layer EML, and may be commonly formed in the pixels PX. Thus, the light emitting layer EML may be interposed between the hole control layer HCL and the electron control layer ECL. The electron control layer ECL may include an electron transport layer and may further include an electron injection layer. A second electrode CE may be disposed on the electron control layer ECL, and may be commonly disposed in the pixels PX. Thus, the second electrode CE may have an area larger than the first electrode AE.

The upper insulating layer TFL is disposed on the second electrode CE, and includes a plurality of thin layers. As in the present exemplary embodiment, the thin layers may include a thin film encapsulation layer and a capping layer, which are functionally distinguished from each other.

In the present exemplary embodiment, the thin film encapsulation layer is disposed to entirely overlap with the display area DP-DA of FIGS. 3A and 3C, and encapsulates the organic light emitting diode OLED disposed in the display area DP-DA. The thin film encapsulation layer may not be disposed in the non-display area DP-NDA and may be disposed in a portion of the non-display area DP-NDA. In addition, the thin film encapsulation layer may include at least one organic encapsulation layer.

In an exemplary embodiment of the present disclosure, the organic light emitting diode OLED may further include a resonance structure to control a resonance distance of the light generated by the light emitting layer EML. The resonance structure is disposed between the first electrode AE and the second electrode CE, and a thickness of the resonance structure may be determined depending on a wavelength of the light generated by the light emitting layer EML.

Figure 4A:
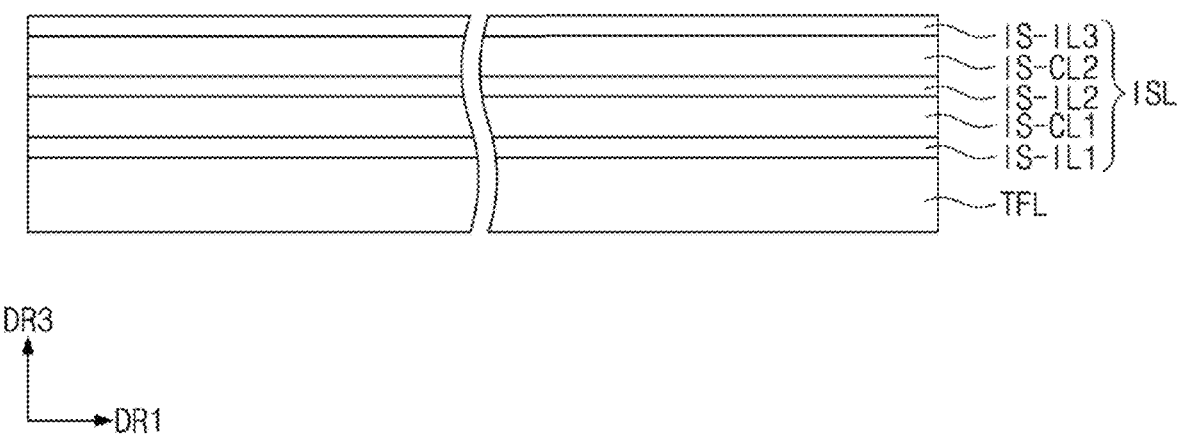
FIG. 4A is a cross-sectional view illustrating an input sensor according to an exemplary embodiment of the present disclosure.
Figure 4B:
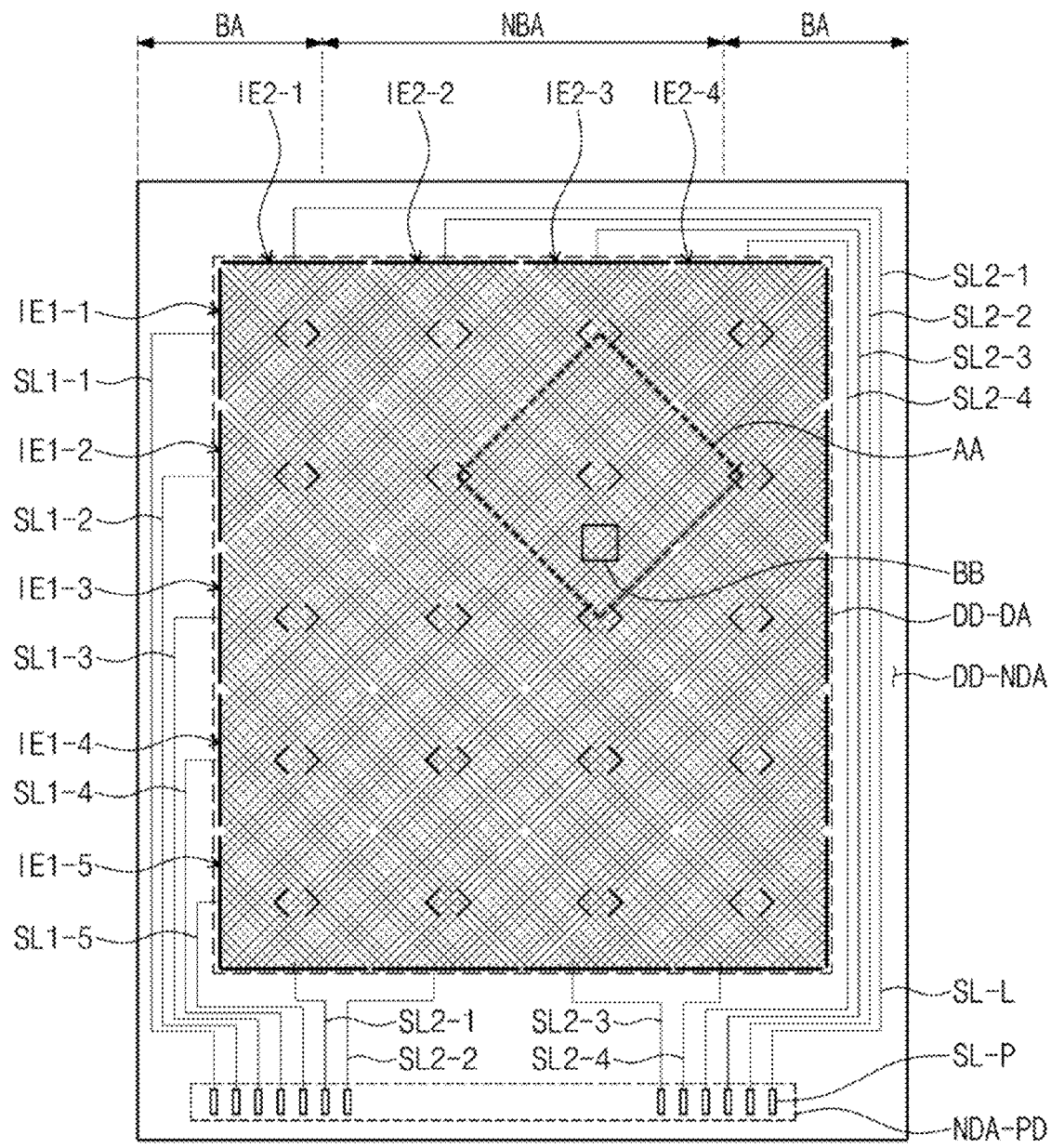
FIG. 4B is a plan view illustrating an input sensor according to an exemplary embodiment of the present disclosure.

FIG. 4A is a cross-sectional view illustrating an input sensor according to an exemplary embodiment of the present disclosure. FIG. 4B is a plan view illustrating the input sensor according to an exemplary embodiment of the present disclosure. In FIGS. 4A and 4B, the input sensing layer ISL will be described as a representative example of the input sensor. The input sensing layer ISL illustrated in FIGS. 4A and 4B is in the stretched state.

FIG. 4A schematically illustrates the input sensing layer ISL to explain a stacking relationship of the input sensing layer ISL. As illustrated in FIG. 4A, the input sensing layer ISL according to an exemplary embodiment of the present disclosure may include a first insulating layer IS-IL1, a first conductive layer IS-CL1, a second insulating layer IS-IL2, a second conductive layer IS-CL2, and a third insulating layer IS-IL3. The first insulating layer IS-IL1 may be directly disposed on the upper insulating layer TFL. In an exemplary embodiment of the present disclosure, the first insulating layer IS-IL1 may be omitted. The first insulating layer IS-IL1, the second insulating layer IS-IL2, and the third insulating layer IS-IL3 may be respectively referred to as a lower insulating layer IS-IL1, an intermediate insulating layer IS-IL2, and an upper insulating layer IS-IL3 reflecting their stacking order. For example, the input sensing layer ISL may include the first conductive layer IS-CL1 disposed on the first insulating layer IS-IL1, the second conductive layer IS-CL2 disposed over the first conductive layer IS-CL1, the second insulating layer IS-IL2 disposed between the first conductive layer IS-CL1 and the second conductive layer IS-CL2, and the third insulating layer IS-IL3 disposed on the second conductive layer IS-CL2.

Each of the first conductive layer IS-CL1 and the second conductive layer IS-CL2 may have a single-layer structure or a multi-layer structure with layers stacked in the third directional DR3. The conductive layer (e.g., the first conductive layer IS-CL1 or the second conductive layer IS-CL2) having the single layer structure may include a metal layer or a transparent conductive layer. The conductive layer having the multi-layer structure may include at least two layers among transparent conductive layers and metal layers. The conductive layer having the multi-layer structure may include metal layers including metals different from each other. The transparent conductive layer may include, for example, indium tin oxide (ITO), indium zinc oxide (IZO), zinc oxide (ZnO), indium tin zinc oxide (ITZO), poly(3,4-ethylenedioxythiophene) (PEDOT), a metal nanowire, or a graphene. The metal layer may include, for example, molybdenum (Mo), silver (Ag), titanium (Ti), copper (Cu), aluminum (Al), or alloys thereof. According to an exemplary embodiment of the present disclosure, each of the first conductive layer IS-CL1 and the second conductive layer IS-CL2 may have a three-layer structure of titanium/aluminum/titanium (Ti/Al/Ti). In an exemplary embodiment of the present disclosure, the conductive layer of the multi-layer structure may include at least one metal layer and at least one transparent conductive layer.

Each of the first conductive layer IS-CL1 and the second conductive layer IS-CL2 may include a plurality of conductive patterns. The conductive patterns may include sensing electrodes and signal lines connected to the sensing electrodes. The sensing electrodes including the transparent conductive layer are not viewed by a user compared to the sensing electrodes including the metal layer. Thus, to prevent the sensing electrodes including the metal layer from being viewed by a user, the sensing electrodes including the metal layer may have a mesh shape. The mesh-shaped sensing electrodes may increase flexibility and reduce noise on the display panel DP. Some of the conductive patterns may be connected to each other to form one sensing electrode (hereinafter, referred to as a "first sensing electrode"). The first sensing electrode may be provided in a plural number. Some of the conductive patterns may be connected to each other to form another sensing electrode (hereinafter, referred to as a "second sensing electrode"). The conductive patterns may include a plurality of second sensing electrodes. The first sensing electrodes are insulated from (e.g., not in contact with) the second sensing electrodes while crossing the second sensing electrodes.

Each of the first, second, and third insulating layers, IS-IL1, IS-IL2, and IS-IL3 may include an inorganic material or an organic material. In the present exemplary embodiment, each of the first insulating layer IS-IL1 and the second insulating layer IS-IL2 may be an inorganic layer. The inorganic layer may include at least one of, for example, aluminum oxide ($Al_2O_3$), titanium oxide ($TiO_2$), silicon oxide ($SiO_2$), silicon nitride ($Si_3N_4$), silicon oxynitride (SiON), zirconium oxide ($ZrO_2$), and hafnium oxide ($HfO_2$). The inorganic layer may have a thickness in a range from about 1000 angstroms to about 4000 angstroms. In an exemplary embodiment of the present disclosure, the second insulating layer IS-IL2 (i.e., the intermediate insulating layer) may include a silicon oxide layer ($SiO_2$), a silicon nitride ($Si_3N_4$) layer, or a silicon oxynitride (SiON) layer.

The third insulating layer IS-IL3 may include an organic layer. The organic layer may include at least one of, for example, an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

As illustrated in FIG. 4B, the input sensing layer ISL may include first sensing electrodes IE1-1 to IE1-5, first signal lines SL1-1 to SL1-5 respectively connected to the first sensing electrodes IE1-1 to IE1-5, second sensing electrodes IE2-1 to IE2-4, and second signal lines SL2-1 to SL2-4 respectively connected to the second sensing electrodes IE2-1 to IE2-4. As shown in FIG. 4B, the first sensing electrodes IE1-1 to IE1-5 and the second sensing electrodes IE2-1 to IE2-4 may each have a mesh shape.

The first sensing electrodes IE1-1 to IE1-5 and the second sensing electrodes IE2-1 to IE2-4 may cross each other. The first sensing electrodes IE1-1 to IE1-5 may be arranged in the first direction DR1 and may extend in the second direction DR2, while the second sensing electrodes IE2-1 to IE2-4 may be arranged in the second direction DR2 and may extend in the first direction DR1. An external input may be sensed by a mutual capacitance method and/or a self-capacitance method. Coordinates of the external input may be calculated by the mutual capacitance method during a first period and may be recalculated by the self-capacitance method during a second period.

The first signal lines SL1-1 to SL1-5 are respectively connected to one ends of the first sensing electrodes IE1-1 to IE1-5. The second signal lines SL2-1 to SL2-4 are respectively connected to both ends of the second sensing electrodes IE2-1 to IE2-4. Since the second sensing electrodes IE2-1 to IE2-4 are longer than the first sensing electrodes IE1-1 to IE1-5, a voltage drop of a detection signal (or a transmission signal) occurs and thus sensing sensitivity may be reduced. According to the present exemplary embodiment, a detection signal (or a transmission signal) is provided through the second signal lines SL2-1 to SL2-4 connected to two opposite ends of the second sensing electrodes IE2-1 to IE2-4, a voltage drop of a detection signal (or a transmission signal) may be prevented and thus reduction of sensing sensitivity may be prevented. In an exemplary embodiment of the present disclosure, the first signal lines SL1-1 to SL1-5 may be connected to both ends of the first sensing electrodes IE1-1 to IE1-5. In an exemplary embodiment of the present disclosure, the second signal lines SL2-1 to SL2-4 may be connected to only one ends of the second sensing electrodes IE2-1 to IE2-4.

Figure 5A:
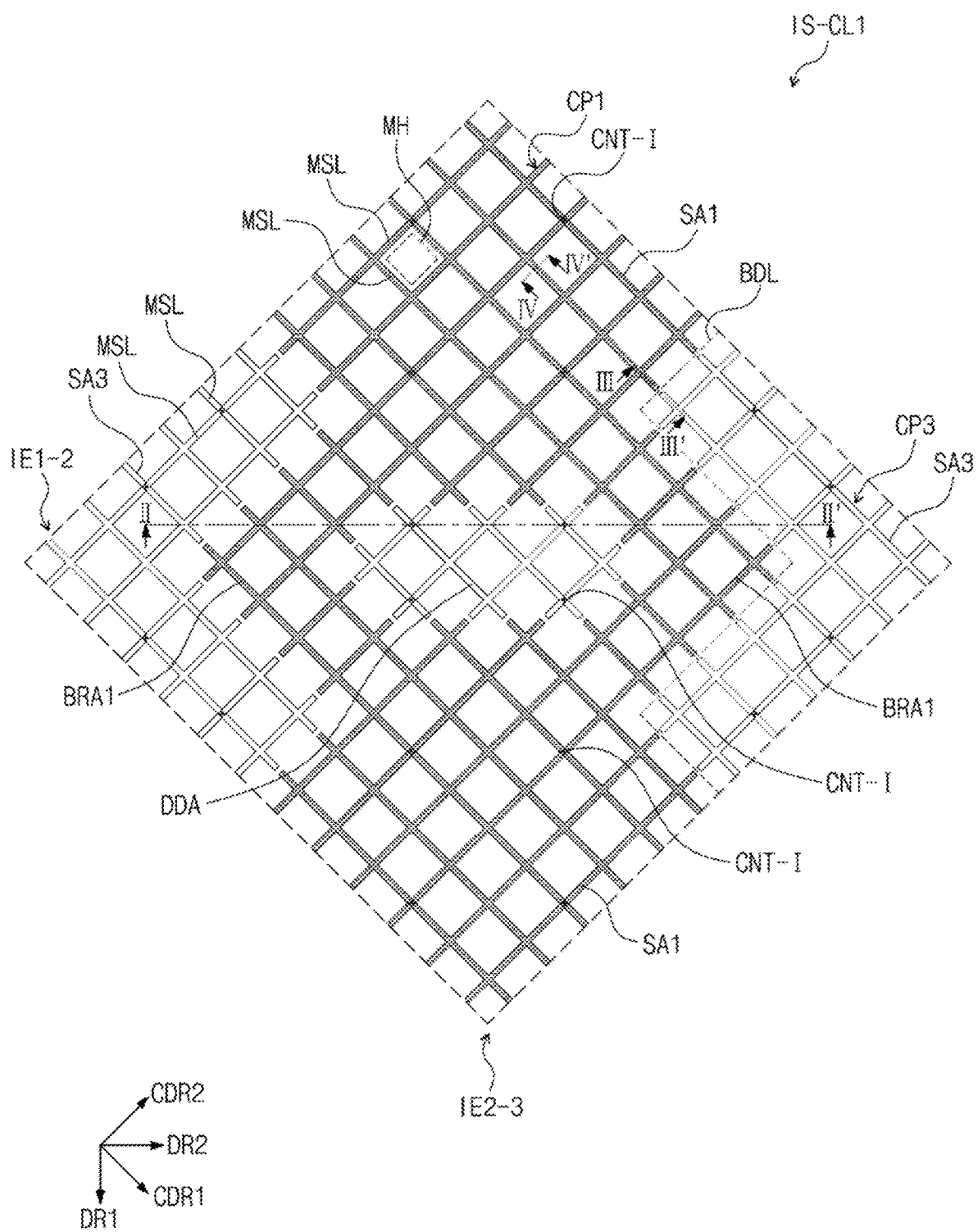
FIGS. 5A and 5B are enlarged plan views illustrating area AA of FIG. 4B.
Figure 5B:
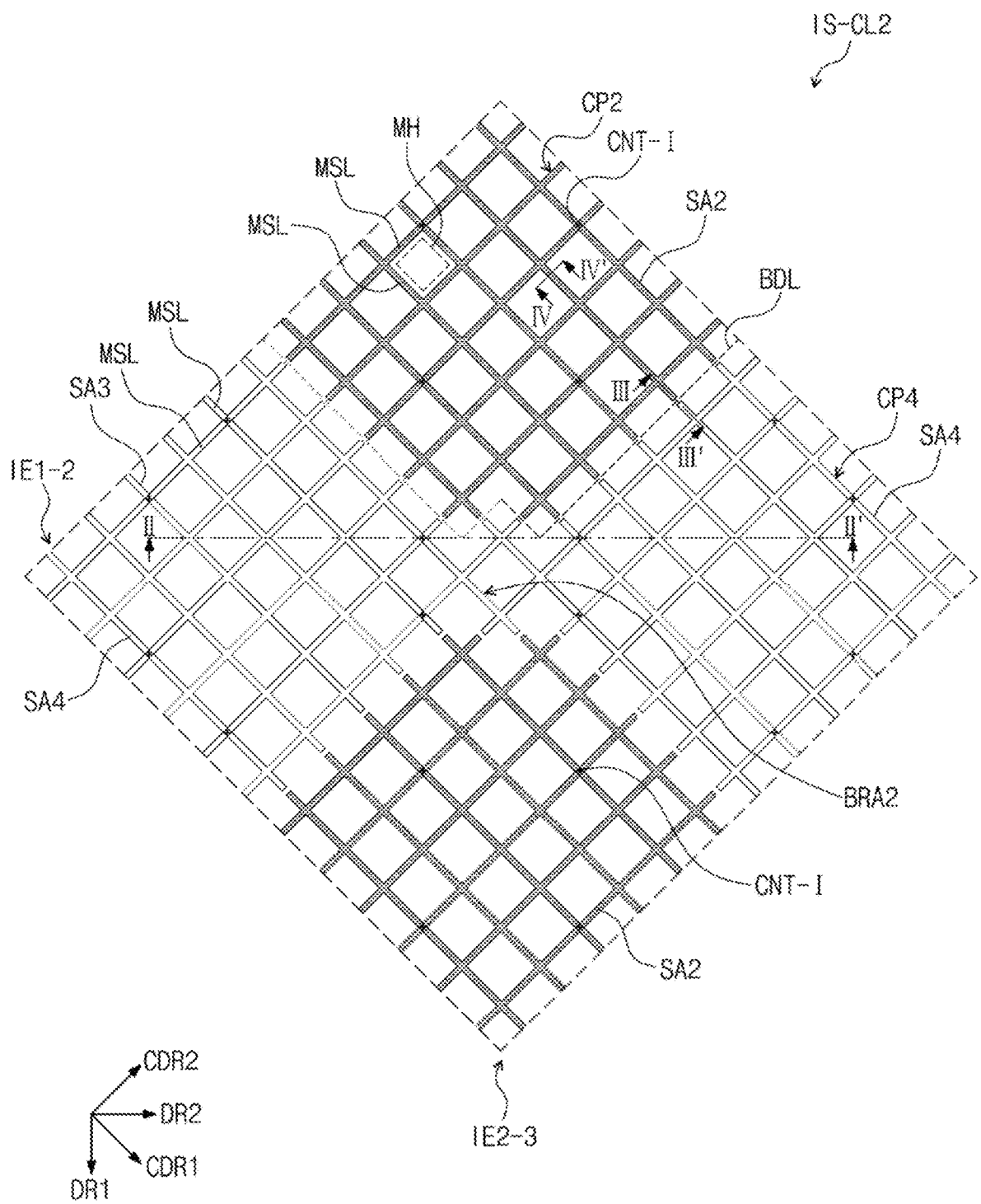
Figure 5C:
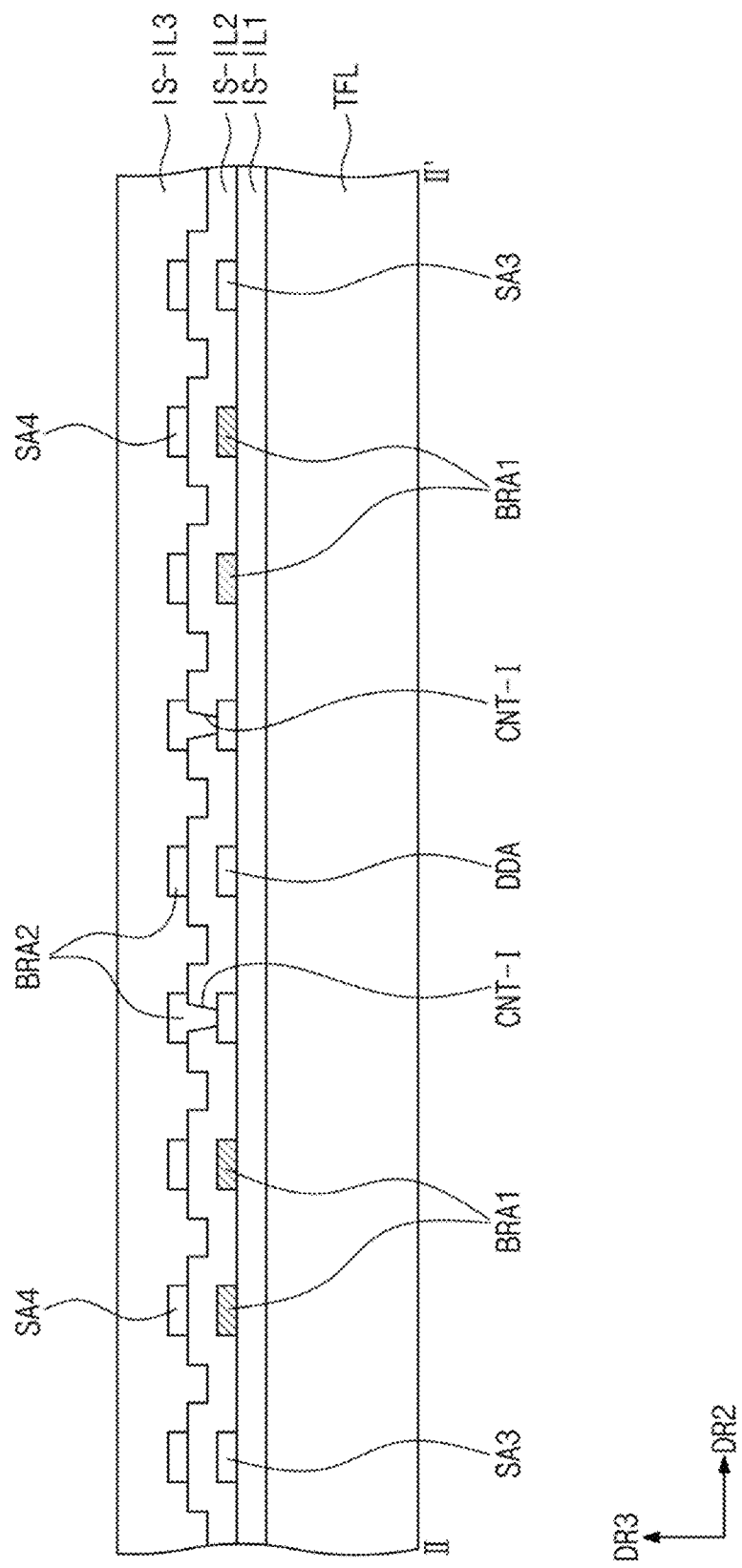
FIG. 5C is a cross-sectional view illustrating an input sensor taken along line II-II' of FIGS. 5A and 5B.

FIGS. 5A and 5B are enlarged plan views illustrating area AA of FIG. 4B. FIG. 5C is a cross-sectional view illustrating an input sensor taken along line II-II' of FIGS. 5A and 5B. FIGS. 5D to 5G are cross-sectional views illustrating an input sensor taken along line III-III' of FIGS. 5A and 5B. FIG. 5H is a cross-sectional view illustrating an input sensor taken along line IV-IV' of FIGS. 5A and 5B. FIG. 5I is a SEM image illustrating a crack occurring in an insulating layer of an input sensor. Hereinafter, the input sensing layer ISL will be described as the input sensor.

FIGS. 5A and 5B illustrate one crossing area where one first sensing electrode IE1-2 and one second sensing electrode IE2-3 cross each other. FIG. 5A illustrates conductive patterns (hereinafter, referred to as "first conductive patterns") of the first conductive layer IS-CL1 corresponding to the crossing area, and FIG. 5B illustrates conductive patterns (hereinafter, referred to as "second conductive patterns") of the second conductive layer IS-CL2 corresponding to the crossing area.

Each of the first conductive patterns and the second conductive patterns include a plurality of mesh lines MSL. The mesh lines MSL cross each other to define mesh holes MH. Some of the mesh lines MSL extend in a first diagonal direction CDR1, and some other mesh lines MSL extend in a second diagonal direction CDR2.

Some of the first conductive patterns of the first conductive layer IS-CL1 are connected to some of the second conductive patterns of the second conductive layer IS-CL2 to form the first sensing electrodes IE1-1 to IE1-5 shown in FIG. 4B. Some other of the first conductive patterns are connected to some other of the second conductive patterns to form the second sensing electrodes IE2-1 to IE2-4 shown in FIG. 4B. By using two layers (e.g., the first conductive layer IS-CL1 and the second conductive layer IS-CL2) of the sensing electrodes such as the first sensing electrodes IE1-1 to IE1-5 and the second sensing electrodes IE2-1 to IE2-4, a resistance of each of the sensing electrodes may be lowered.

The some of the first conductive patterns forming the first sensing electrode IE1-2 may be defined as a first pattern, and the some of the second conductive patterns forming the first sensing electrode IE1-2 may be defined as a second pattern. In this case, the some other of the first conductive patterns forming the second sensing electrode IE2-3 may be defined as a third pattern, and the some other of the second conductive patterns forming the second sensing electrode IE2-3 may be defined as a fourth pattern. However, the definitions above are relative concept. That is, the some of the first conductive patterns forming the second sensing electrode IE2-3 may be defined as the first pattern, and the some of the second conductive patterns forming the second sensing electrode IE2-3 may be defined as the second pattern. In addition, the some other of the first conductive patterns forming the first sensing electrode IE1-2 may be defined as the third pattern, and the some other of the second conductive patterns forming the first sensing electrode IE1-2 may be defined as the fourth pattern. Hereinafter, the latter will be described.

As illustrated in FIGS. 5A to 5C, the second sensing electrode IE2-3 includes a first pattern CP1 formed from the first conductive layer IS-CL1 and a second pattern CP2 formed from the second conductive layer IS-CL2. The first pattern CP1 and the second pattern CP2 are electrically connected to each other via a contact hole CNT-1 defined through the second insulating layer IS-IL2. The first pattern CP1 and the second pattern CP2 overlap with each other when viewed in a plan view. The first pattern CP1 and the second pattern CP2 should not be limited to a structure in which the first pattern CP1 and the second pattern CP2 completely overlap with each other. For example, at least a portion of the first pattern CP1 may not be overlapped by the second pattern CP2, and/or at least a portion of the second pattern CP2 may not be overlapped by the first pattern CP1. In an exemplary embodiment of the present disclosure, the second pattern CP2 may be completely overlapped by the first pattern CP1, while at least a portion of the first pattern CP1 may not be overlapped by the second pattern CP2.

The first pattern CP1 includes first sensor areas SA1 and first bridge areas BRA1 connecting the first sensor areas SA1. Two first sensor areas SA1 are disposed spaced apart from each other in the first direction DR1. Each of the second sensing electrodes IE2-1 to IE2-4 illustrated in FIG. 4B includes a plurality of crossing areas arranged in the first direction DR1. Two first sensor areas SA1 are disposed at every crossing area as one group. Each of the first bridge areas BRA1 connects two first sensor areas SA1. Two first bridge areas BRA1 are disposed spaced apart from each other in the second direction DR2.

The second pattern CP2 includes second sensor areas SA2 overlapping with the first sensor areas SA1. Two second sensor areas SA2 are disposed spaced apart from each other in the first direction DR1. Thus, a direction (e.g., the first direction DR1) in which the first sensor areas SA1 are arranged is the same as a direction (e.g., the first direction DR1) in which the second sensor areas SA2 are arranged. Each of the second sensing electrodes IE2-1 to IE2-4 shown in FIG. 4B includes a plurality of crossing areas arranged in the first direction DR1. Two second sensor areas SA2 are disposed at every crossing area as one group.

The first sensor area SA1 has a size about the same as that of one second sensor area SA2 overlapping therewith. However, since mesh lines MSL of the first sensor area SA1 and mesh lines MSL of the second sensor area SA2 may have different line widths, the first sensor area SA1 may have a size different from that of one second sensor area SA2 overlapping therewith. As illustrated in FIGS. 5A and 5B, a size of the first pattern CP1, which includes both the first sensor area SA1 and the first bridge area BRA1, is larger than a size of the second pattern CP2 which only includes the second sensor area SA2.

The first sensing electrode IE1-2 includes a third pattern CP3 formed from the first conductive layer IS-CL1 and a fourth pattern CP4 formed from the second conductive layer IS-CL2. The third pattern CP3 and the fourth pattern CP4 are electrically connected to each other via the contact hole CNT-1 defined through the second insulating layer IS-IL2. The third pattern CP3 and the fourth pattern CP4 overlap with each other when viewed in a plan view. The third pattern CP3 and the fourth pattern CP4 should not be limited to a structure in which the third pattern CP3 and the fourth pattern CP4 completely overlap with each other. For example, at least a portion of the third pattern CP3 may not be overlapped by the fourth pattern CP4, and/or at least a portion of the fourth pattern CP4 may not be overlapped by the third pattern CP3. In an exemplary embodiment of the present disclosure, the third pattern CP3 may be completely overlapped by the fourth pattern CP4, while at least a portion of the fourth pattern CP4 may not be overlapped by the third pattern CP3.

The third pattern CP3 includes third sensor areas SA3 and a dummy area DDA. The dummy area DDA is spaced apart from the first sensor areas SA1 and the third sensor areas SA3 and disposed between the third sensor areas SA3 in the second direction DR2. In addition, the dummy area DDA is disposed between two first bridge areas BRA1 in the second direction DR2.

The fourth pattern CP4 includes fourth sensor areas SA4 and a second bridge area BRA2. The fourth sensor areas SA4 overlap with the third sensor areas SA3 and the first bridge areas BRA1. The second bridge area BRA2 overlaps with the dummy area DDA. Thus, a direction (e.g., the second direction DR2) in which the third sensor areas SA3 are arranged is the same as a direction (e.g., the second direction DR2) in which the fourth sensor areas SA4 are arranged, and the direction (e.g., the first direction DR1) in which the first sensor areas SA1 are arranged crosses the direction (e.g., the second direction DR2) in which the third sensor areas SA3 are arranged.

The fourth sensor area SA4 has a size relatively larger than that of one third sensor area SA3 overlapping therewith. As illustrated in FIG. 5A, the third sensor area SA3 is relatively reduced so as to secure an area where the first bridge area BRA1 is to be arranged.

As the first pattern CP1 is connected to the second pattern CP2 and the third pattern CP3 is connected to the fourth pattern CP4, a resistance of each of the first sensing electrode IE1-2 and the second sensing electrode IE2-3 may be reduced. The decrease in combined resistance may enhance a sensitivity. For instance, when the combined resistance is lowered, a bandwidth of an AC signal may increase. As the bandwidth of the AC signal increases, a sensitivity of the input sensor using a sinusoidal signal as a driving signal may be enhanced.

Since the sensing electrode has a two-layer structure as a whole, the optical characteristics may be enhanced. As a similar amount of light is reflected from the conductive pattern having the two-layer structure throughout the input sensor, a difference in visibility according to areas is minimized.

FIGS. 5D to 5G illustrate cross sections taken along line of FIGS. 5A and 5B. Referring to FIGS. 5D to 5G, a mesh line MSL1 (hereinafter, referred to as a "first mesh line") of the first pattern CP1 and a mesh line MSL2 (hereinafter, referred to as a "second mesh line") of the second pattern CP2 overlap with each other. The first mesh line MSL1 and the second mesh line MSL2 extend along a reference direction. An edge MSL1-E of the first mesh line MSL1 disposed in the reference direction and an edge MSL2-E of the second mesh line MSL2 disposed in the reference direction are not aligned with each other in a direction (i.e., the third direction DR3) normal to the display surface DD-IS. An edge is defined as the end of the mesh line in the reference direction, and may correspond to the side surface of the mesh line at the same time.

In the present exemplary embodiment, the first diagonal direction CDR1 corresponds to the reference direction. For example, the edge MSL1-E of the first mesh line MSL1 disposed in the reference direction and the edge MSL2-E of the second mesh line MSL2 disposed in the reference direction are not aligned with each other along a direction (i.e., the third direction DR3) perpendicular to a line width direction (i.e., the second diagonal direction CDR2) and the reference direction (i.e., the first diagonal direction CDR1).

As the edge MSL1-E of the first mesh line MSL1 and the edge MSL2-E of the second mesh line MSL2 are not aligned with each other, a stress applied to the second insulating layer IS-IL2 in the bending area BA (refer to FIGS. 2A to 2D) of the input sensors ISL and ISP (refer to FIGS. 2A to 2D) is lowered. Therefore, the second insulating layer IS-IL2 may be prevented from being damaged. For example, the display device DD may thus be resistant to cracking during bending and handling.

FIG. 5I illustrates a crack occurred in an input sensor in which the edge MSL1-E of the first mesh line MSL1 and the edge MSL2-E of the second mesh line MSL2 are aligned with each other. The crack occurred in an inorganic layer corresponding to the second insulating layer IS-IL2 in the bending area BA (refer to FIGS. 2A to 2D). It is assumed that the edge MSL1-E of the first mesh line MSL1 and the edge MSL2-E of the second mesh line MSL2 apply a large stress to an area of the inorganic layer.

Figure 5D:
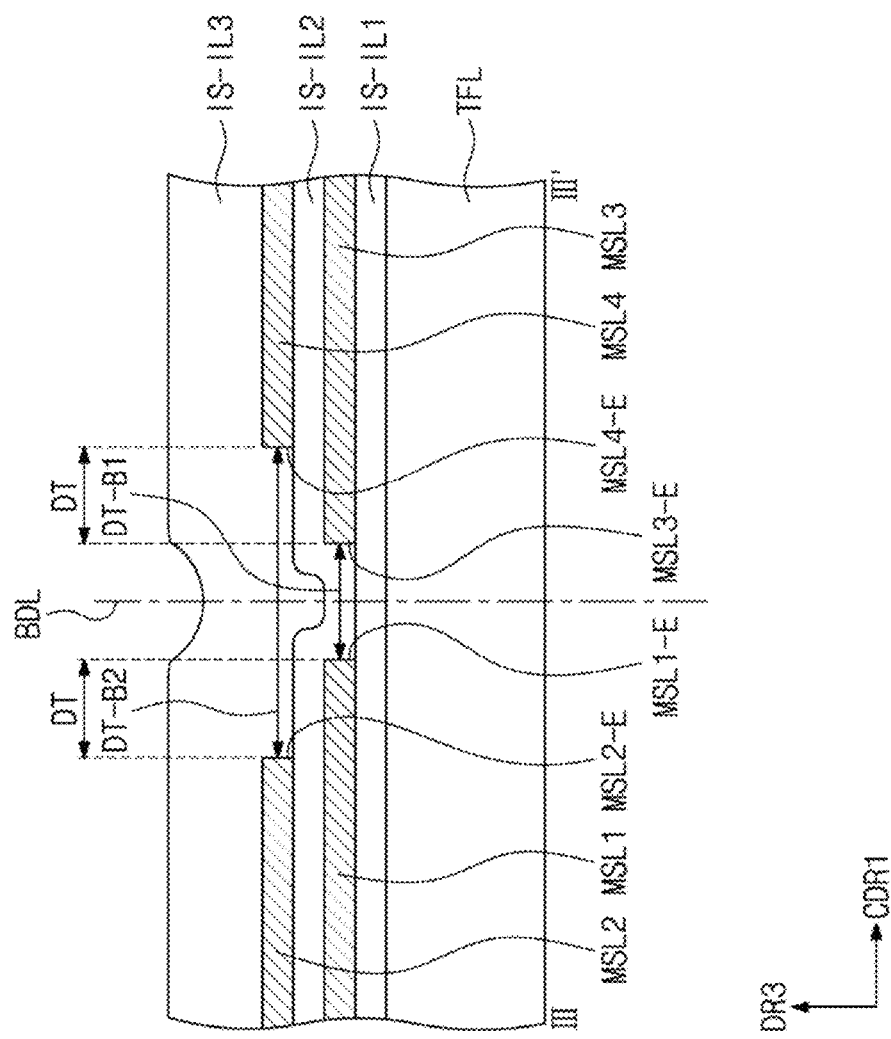
FIGS. 5D to 5G are cross-sectional views illustrating an input sensor taken along line of FIGS. 5A and 5B.

Referring to FIG. 5D, a distance DT between the edge MSL1-E of the first mesh line MSL1 and the edge MSL2-E of the second mesh line MSL2 in the first diagonal direction CDR1 may be in a range from about 1.5 μm to about 5 μm. The first mesh line MSL1 and the second mesh line MSL2 may have a thickness in a range from about 1000 angstroms to about 2000 angstroms. In the mesh line having the three-layer structure of titanium/aluminum/titanium (Ti/Al/Ti), a thickness of the titanium (Ti) layer may be in a range from about 150 angstroms to about 300 angstroms, and a thickness of the aluminum (Al) layer may be in a range from about 1000 angstroms to about 1500 angstroms.

Although the edge MSL1-E of the first mesh line MSL1 and the edge MSL2-E of the second mesh line MSL2 are designed to be aligned with each other as shown in FIG. SI and described above, the edge MSL1-E of the first mesh line MSL1 and the edge MSL2-E of the second mesh line MSL2 may be slightly shifted from each other due to an error in a manufacturing process (e.g., etching process). Most of the shifted values were about 1 μm or less, and a maximum value of the shifted values was about 1.35 μm. The error value may vary depending on a process condition.

FIG. 5H illustrates process errors W-E of the first mesh line MSL1 and the second mesh line MSL2. Even though the first mesh line MSL1 and the second mesh line MSL2 are designed to have the same line width W, the edges of the first mesh line MSL1 and the second mesh line MSL2 disposed in the second diagonal direction CDR2 may be shifted from each other. The process errors W-E were about 1 μm or less, and a maximum value of the process errors W-E was about 1.35 μm. For example, the edge MSL1-E of the first mesh line MSL1 may be shifted in the line width direction, i.e., the second diagonal direction CDR2, away from the edge MSL2-E of the second mesh line MSL2 by a distance corresponding to the process error W-E.

According to the present exemplary embodiment, since the distance DT between the edge MSL1-E of the first mesh line MSL1 and the edge MSL2-E of the second mesh line MSL2 is designed to be larger than a range of the process error W-E, the stress applied to the second insulating layer IS-IL2 may be distributed. That is, when the edge MSL1-E of the first mesh line MSL1 and the edge MSL2-E of the second mesh line MSL2 are spaced apart from each other by a predetermined distance or more, it is possible to prevent a large stress from being applied to a narrow area of the second insulating layer IS-IL2. Since the edges of the first mesh line MSL1 and the second mesh line MSL2 disposed in the second diagonal direction CDR2 may be shifted from each other by a range of the process error W-E in the line width direction (i.e., the second diagonal direction CDR2), and the distance DT between the edge MSL1-E of the first mesh line MSL1 and the edge MSL2-E of the second mesh line MSL2 is designed to be larger than the range of the process error W-E in the reference direction (i.e., the first diagonal direction CDR1), a distance between the edge MSL1-E of the first mesh line MSL1 and the edge MSL2-E of the second mesh line MSL2 in the reference direction (i.e., the first diagonal direction CDR1) is greater than a distance between the edge MSL1-E of the first mesh line MSL1 and the edge MSL2-E of the second mesh line MSL2 in the line width direction (i.e., the second diagonal direction CDR2) perpendicular to the reference direction (i.e., the first diagonal direction CDR1).

When comparing the measured value of the distance DT illustrated in FIG. 5D with the measured value of the process error W-E illustrated in FIG. 5H, a design value of the distance DT excluding the process error may be checked. The distance DT that is actually measured when the process error W-E is about 0 μm corresponds to the design value. In a case where the process error W-E is about 1 μm and the actually measured distance DT is about 4 μm, the design value of the distance DT is about 3 μm.

Referring to FIGS. 5D to 5G, a mesh line MSL3 (hereinafter, referred to as a "third mesh line") of the third pattern CP3 and a mesh line MSL4 (hereinafter, referred to as a "fourth mesh line") of the fourth pattern CP4 overlap with each other. The line width, the materials, the stacked structure, and the distance DT of the first mesh line MSL1 and the second mesh line MSL2 may be equally applied to the third mesh line MSL3 and the fourth mesh line MSL4. However, the distance DT between the edge MSL1-E of the first mesh line MSL1 and the edge MSL2-E of the second mesh line MSL2 should not be limited to the distance the same as that between an edge MSL3-E of the third mesh line MSL3 and an edge MSL4-E of the fourth mesh line MSL4.

In an exemplary embodiment of the present disclosure, the first, second, third and fourth mesh lines MSL1, MSL2, MSL3 and MSL4 may have their edges MSL1-E, MSL2-E, MSL3-E and MSL4-E not aligned with each other in the third direction DR3, and may form step structures (refer to FIG. 5D), overhang structures (refer to FIG. 5E) and combinations thereof (refer to FIGS. 5F and 5G), to reduce a stress applied to the second insulating layer IS-IL2. Therefore, the second insulating layer IS-IL2 may be prevented from being damaged. For example, the display device DD may thus be resistant to cracking during bending and handling. Thus, a length of a step portion of the first mesh line MSL1 not overlapping the second mesh line MSL2 measured in the reference direction (i.e., the first diagonal direction CDR1) or a length of an overhang portion of the second mesh line MSL2 not overlapping the first mesh line MSL1 measured in the reference direction (i.e., the first diagonal direction CDR1) is in a range from about 1.5 µm to about 5 µm, and is larger than a range of the normal process error W-E.

A distance DT-B1 (hereinafter, referred to as a "first boundary distance") between the edge MSL1-E of the first mesh line MSL1 and the edge MSL3-E of the third mesh line MSL3 may be different from a distance DT-B2 (hereinafter, referred to as a "second boundary distance") between the edge MSL2-E of the second mesh line MSL2 and the edge MSL4-E of the fourth mesh line MSL4. A relatively large distance for each of the first boundary distance DT-B1 and the second boundary distance DT-B2 may be in a range from about 6 µm to about 15 µm. A relatively small distance for each of the first boundary distance DT-B1 and the second boundary distance DT-B2 may be in a range from about 1 µm to about 5 µm. The difference between the first boundary distance DT-B1 and the second boundary distance DT-B2 may be in a range from about 3 µm to about 10 µm. The values described above are values obtained by excluding values of process error W-E. For example, the actually measured values may need to add the value of the process error W-E illustrated in FIG. 5H to the values described above. FIG. 5D illustrates an exemplary embodiment in which the second boundary distance DT-B2 is larger than the first boundary distance DT-B1. The first boundary distance DT-B1 and the second boundary distance DT-B2 each correspond to a shortest distance crossing a boundary line BDL.

Referring to FIGS. 5A to 5D, the first pattern CP1 and the third pattern CP3 correspond to a mesh pattern (hereinafter, referred to as "first mesh pattern") disposed on the same layer, for example, the first conductive layer IS-CL1, and divided into different patterns by the boundary line BDL (refer to FIGS. 5A, 5B, and 5D). In other words, the first pattern CP1 and the third pattern CP3 are divided into different sensing areas by patterning the first mesh pattern along the boundary line BDL. The first pattern CP1 may be defined as a first sensing area, or specifically defined as first sensor areas SA1 and first bridge areas BRA1, and the third pattern CP3 may be defined as a second sensing area, or specifically defined as third sensor areas SA3 and a dummy area DDA. Thus, the first mesh pattern may include the first sensing area and the second sensing area, which are separated from each other when viewed in a plan view.

The second pattern CP2 and the fourth pattern CP4 correspond to a second mesh pattern disposed on a layer different from that of the first mesh pattern and divided into different patterns by the boundary line BDL. The second pattern CP2 may be defined as a third sensing area, or specifically defined as second sensor areas SA2, and the fourth pattern CP4 may be defined as a fourth sensing area, or specifically defines as fourth sensor areas SA4 and a second bridge area BRA2. Thus, the second mesh pattern may include the third sensing area and the fourth sensing area, which are separated from each other when viewed in a plan view.

In the present exemplary embodiment, the first boundary distance DT-B1 may be smaller than the second boundary distance DT-B2 by about 3 µm to about 10 µm.

The first to fourth sensing areas are described with respect to two types of sensing electrodes IE1-2 and IE2-3, however, the present disclosure is not limited thereto. For example, in an exemplary embodiment of the present disclosure, the first to fourth sensing areas may be applied to an input sensor that includes only one type of sensing electrode arranged in a matrix form. In an exemplary embodiment of the present disclosure, the first to fourth sensing areas may be applied to two sensing electrodes identically.

Figure 5E:
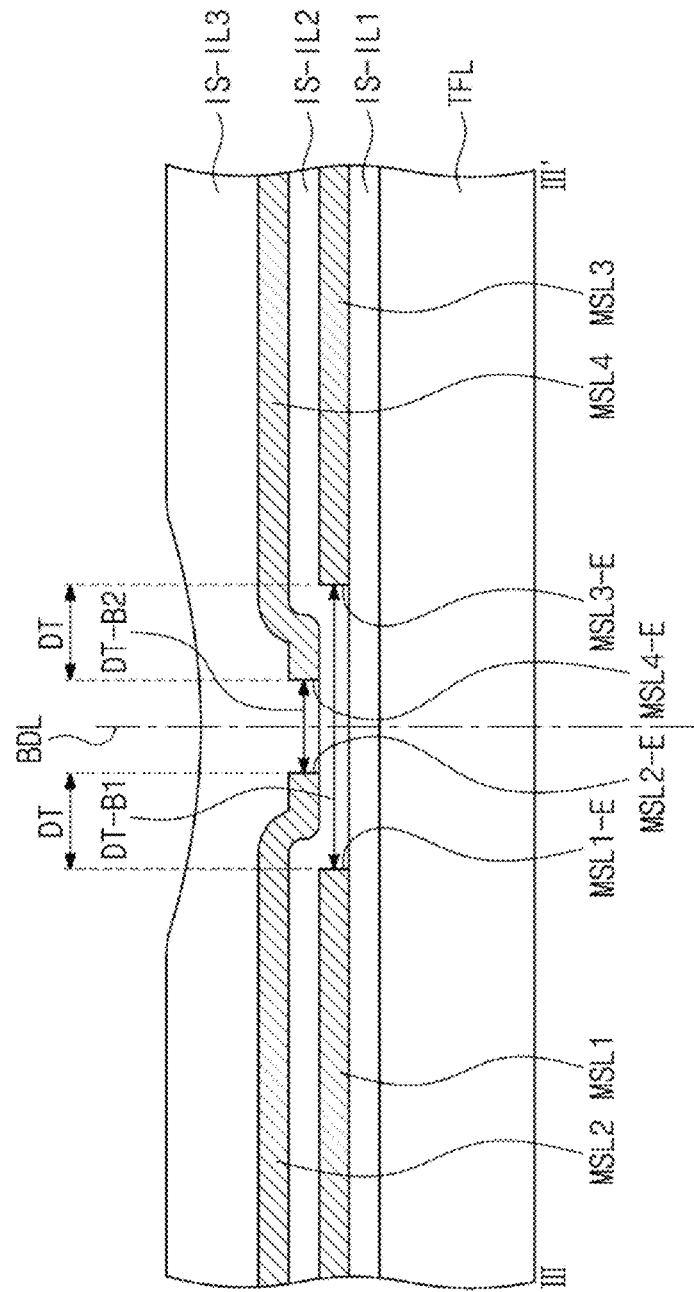
Figure 5F:
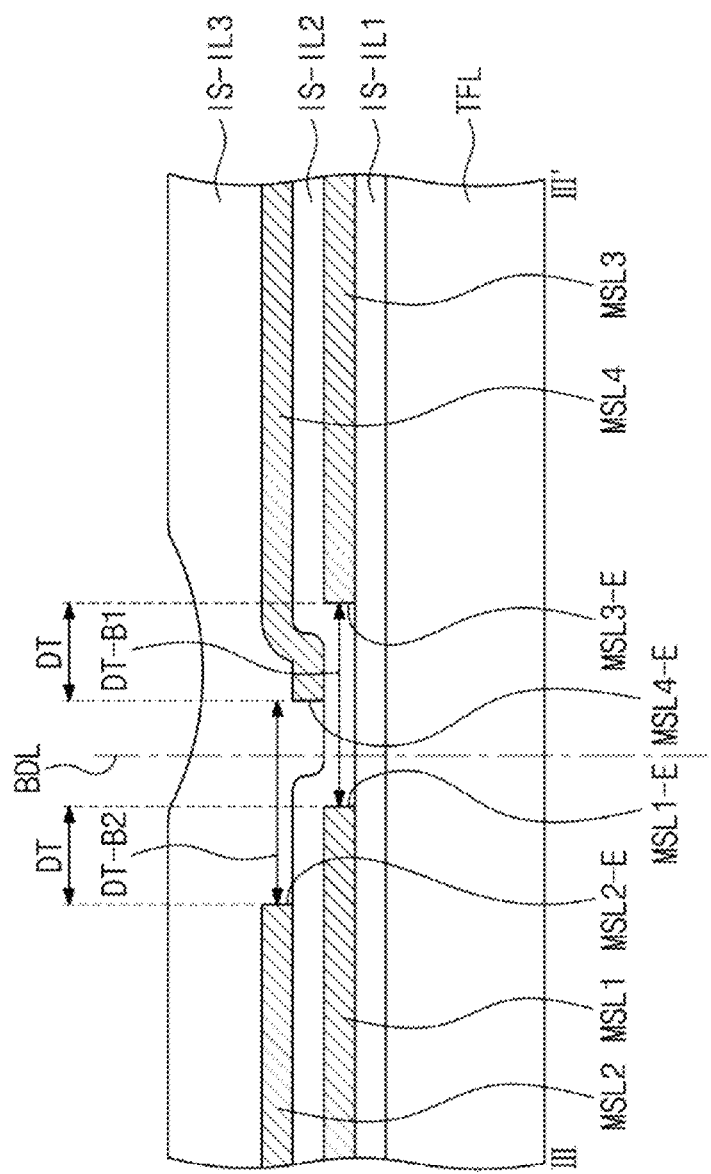
Figure 5G:
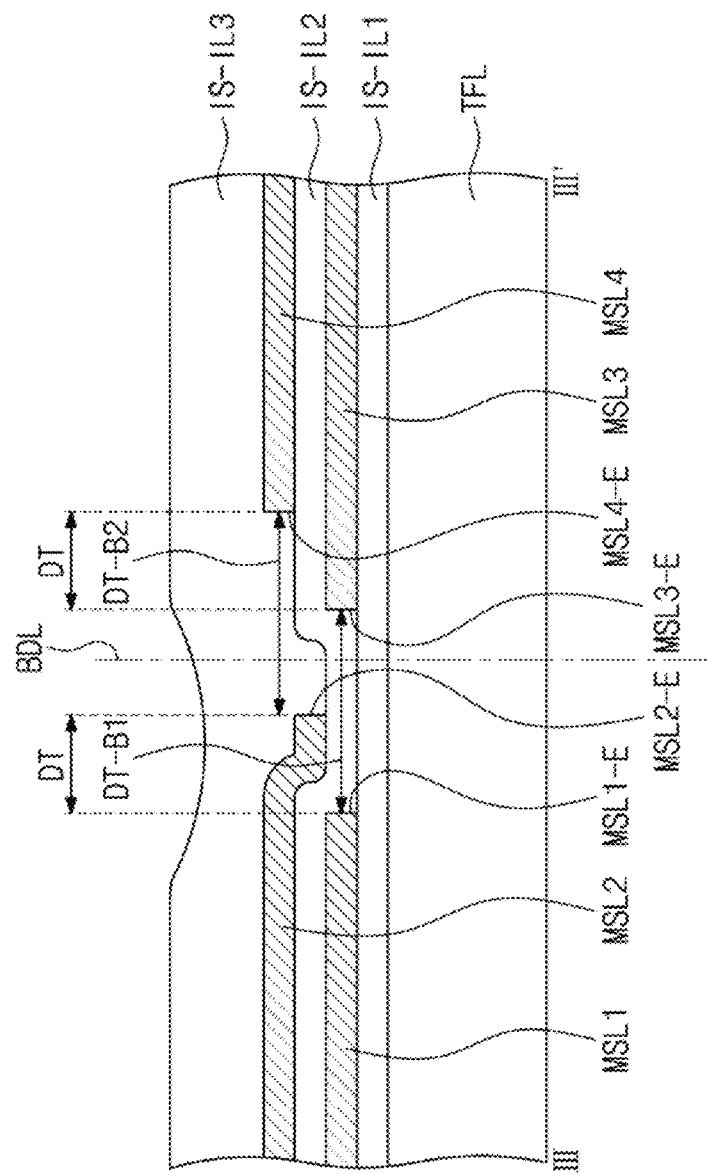
Figure 5H:
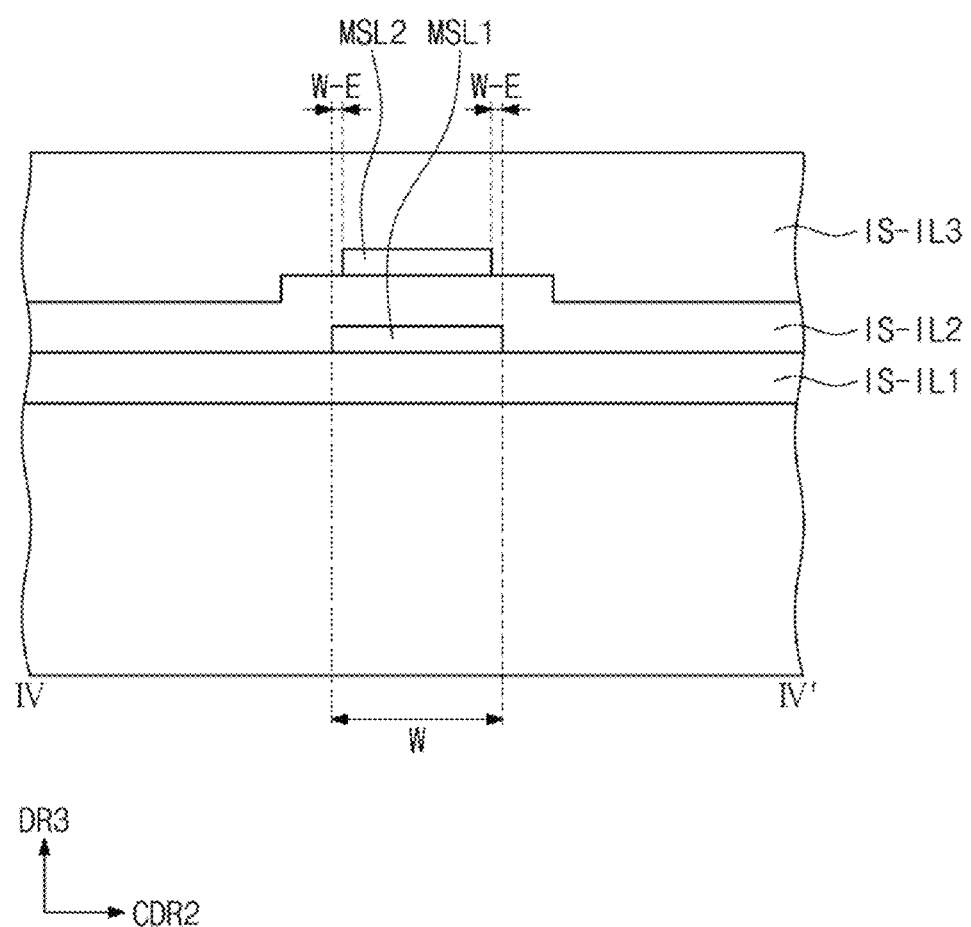
FIG. 5H is a cross-sectional view illustrating an input sensor taken along line IV-IV' of FIGS. 5A and 5B.
Figure 5I:
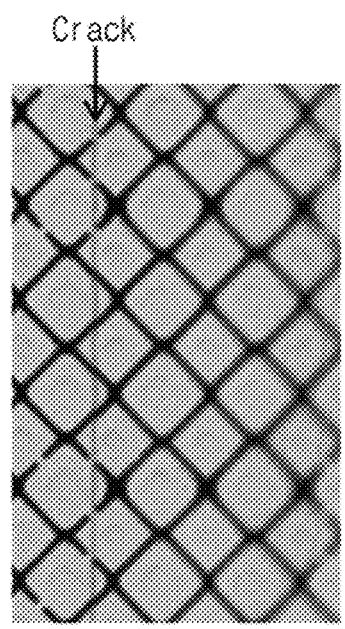
FIG. 5I is a SEM image illustrating a crack occurring in an insulating layer of an input sensor.

Referring to FIG. 5E, the first boundary distance DT-B1 may be greater than the second boundary distance DT-B2. In the present exemplary embodiment, the first boundary distance DT-B1 may be greater than the second boundary distance DT-B2 by about 3 µm to about 10 µm. FIGS. 5F and 5G illustrate an exemplary embodiment in which a difference between the first boundary distance DT-B1 and the second boundary distance DT-B2 is smaller than about 2 µm. As shown in FIGS. 5D to 5G, the first, second, third and fourth mesh lines MSL1, MSL2, MSL3 and MSL4 may form a step structure and/or an overhang structure around the boundary line BDL. In FIGS. 5F and 5G; both the step structure and the overhang structure are present, and thus, the difference between the first boundary distance DT-B1 and the second boundary distance DT-B2 can be small, while the distance DT of the first mesh line MSL1 and the second mesh line MSL2 and the distance DT of the third mesh line MSL3 and the fourth mesh line MSL4 may maintain large.

Figure 6A:
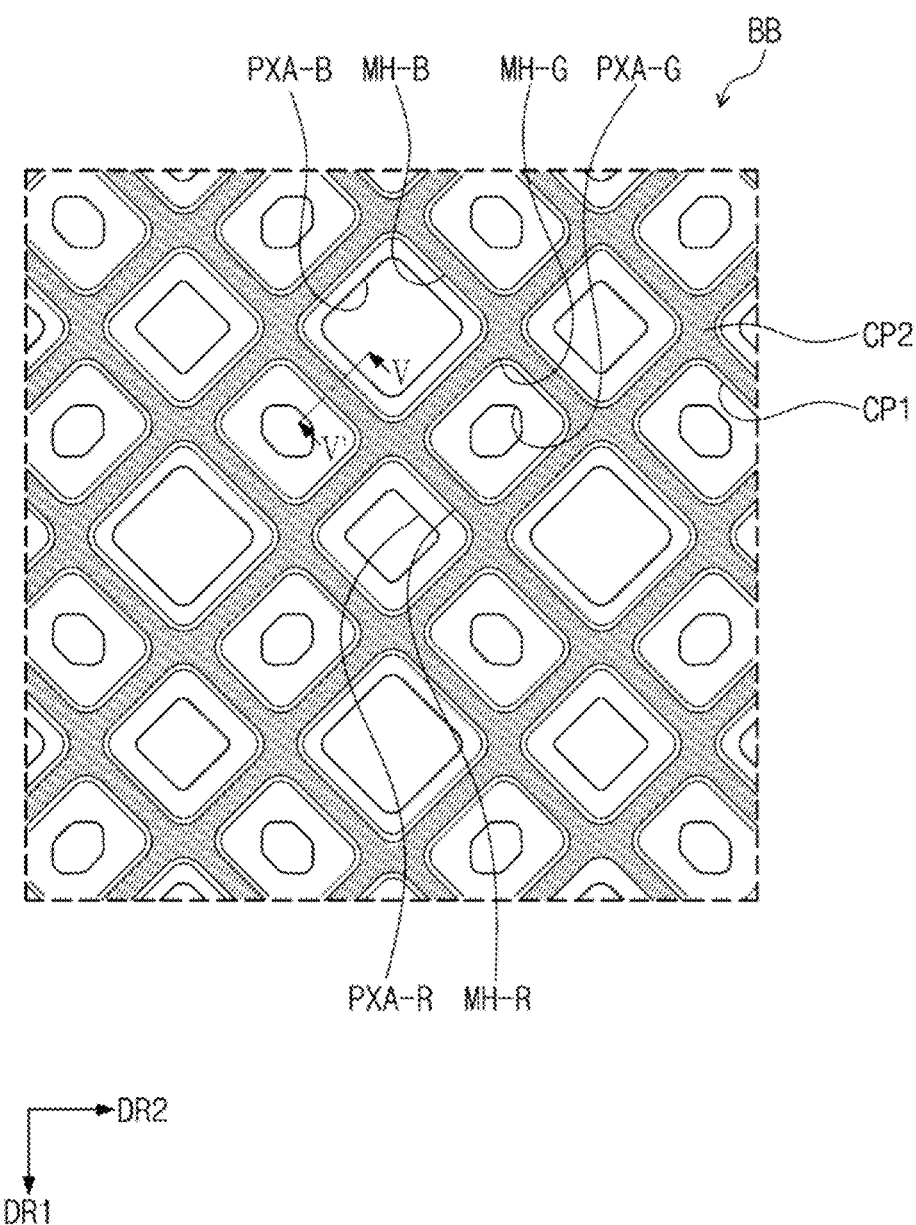
FIG. 6A is an enlarged plan view illustrating area BB of FIG. 4B.
Figure 6B:
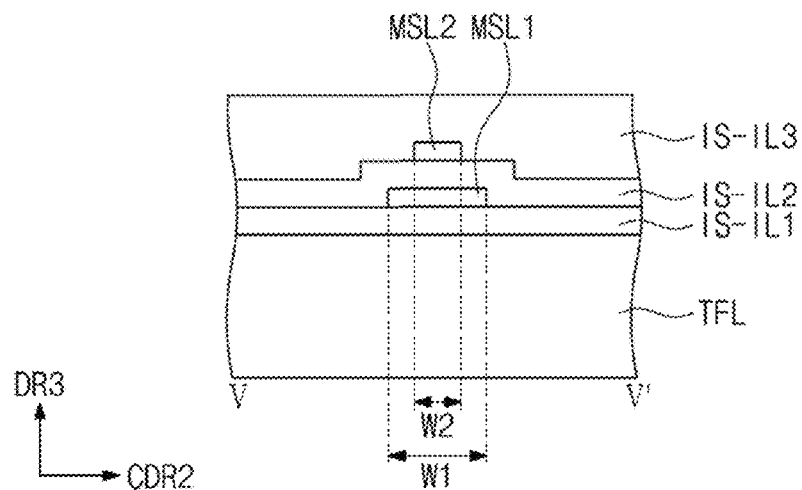
FIGS. 6B to 6D are cross-sectional views taken along line V-V' of FIG. 6A.
Figure 6C:
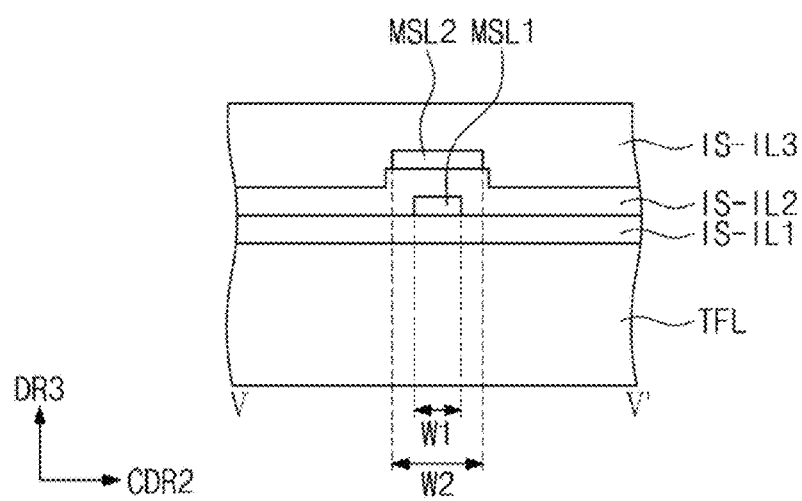
Figure 6D:
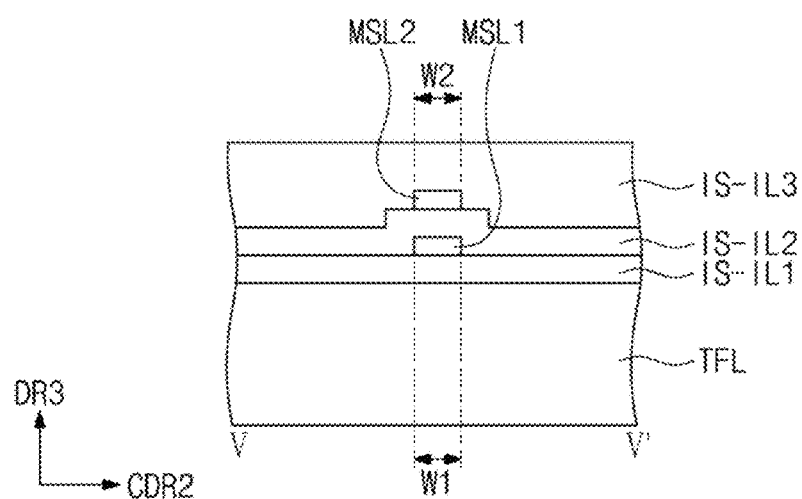

FIG. 6A is an enlarged plan view illustrating area BB of FIG. 4B. FIGS. 6B to 6D are cross-sectional views taken along line V-V' of FIG. 6A.

FIG. 6A illustrates an enlarged view of a portion of the mesh-shaped second sensing electrode IE2-3. The mesh line of the first pattern CP1 and the mesh line of the second pattern CP2 that form the second sensing electrode IE2-3 are illustrated to overlap with each other.

Three types of mesh holes MH-R, MH-G, and MH-B are defined through the second sensing electrode IE2-3. The mesh holes MH-R, MH-G, and MH-B are defined through each of the first pattern CP1 and the second pattern CP2. However, reference numerals are assigned to only the mesh holes MH-R, MH-G, and MH-B of the second pattern CP2 in FIG. 6A.

The three types of mesh holes MH-R, MH-G, and MH-B correspond to three types of light emitting openings OP-G, OP-R, and OP-B. The three types of light emitting openings OP-G, OP-R, and OP-B are defined to be the same as the opening OP of the pixel defining layer PDL illustrated in FIG. 3D. The three types of light emitting openings OP-G, OP-R, and OP-B are distinguished from each other according to their sizes, and the size of each of a first-type opening OP-G, a second-type opening OP-R, and a third-type opening OP-B is proportional to a size of a light emitting area of a corresponding pixel. For example, each of the three types of light emitting openings OP-G, OP-R, and OP-B may be proportional to the size of each of the three light emitting areas PXA-G, PXA-R and PXA-B, respectively. In the present exemplary embodiment, the pixel PX of the light emitting area PXA-R may generate the red light, the pixel PX of the light emitting area PXA-G may generate the green light, and the pixel PX of the light emitting area PXA-B may generate the blue light.

Different from the mesh lines illustrated in a straight line in FIGS. 5A to 5G, inflection points are arranged in the mesh lines illustrated in FIG. 6A. This is because the mesh lines define a plurality of types of mesh holes MH-R, MH-G, and MH-B.

Referring to FIGS. 6B and 6C, the first mesh line MSL1 and the second mesh line MSL2 have line widths different from each other. A difference between a line width W1 of the first mesh line MSL1 and a line width W2 of the second mesh line MSL2 is a value outside a range of the process error W-E described with reference to FIG. 5H, and the line width W1 of the first mesh line MSL1 and the line width W2 of the second mesh line MSL2 are intentionally designed to be different from each other. In FIG. 6B, the line width W1 of the first mesh line MSL1 is larger than the line width W2 of the second mesh line MSL2, and in FIG. 6C, the line width W1 of the first mesh line MSL1 is smaller than the line width W2 of the second mesh line MSL2.

Referring to FIG. 6D, the first mesh line MSL1 and the second mesh line MSL2 have substantially the same line width as each other. For example, the line width W1 of the first mesh line MSL1 and the line width W2 of the second mesh line MSL2 are about the same. A difference between the line width W1 of the first mesh line MSL1 and the line width W2 of the second mesh line MSL2 may be within a range of the process error W-E described with reference to FIG. 5H. Here, the process error W-E may be about 1 µm or less, or may be about 0 µm.

Figure 7A:
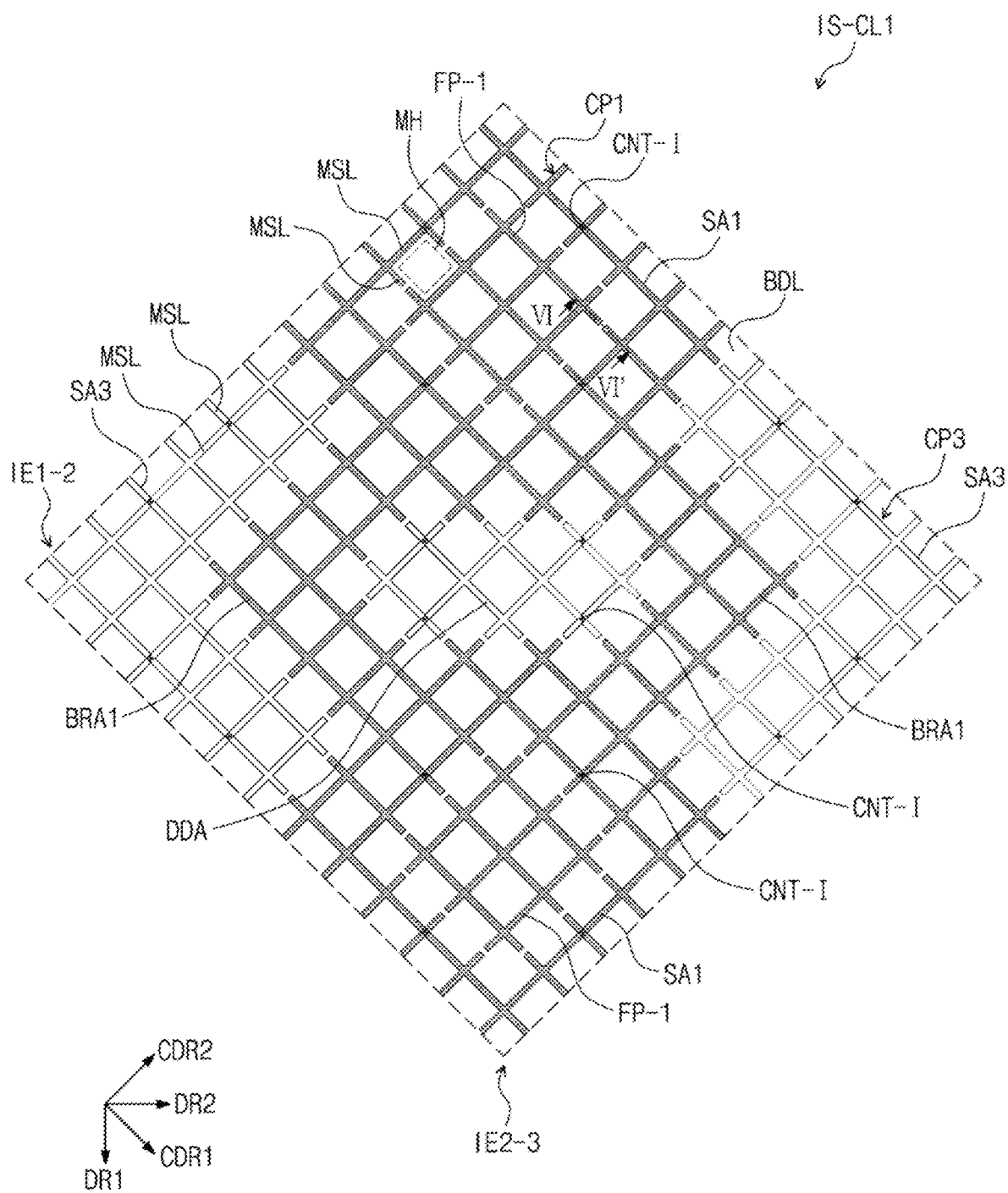
FIGS. 7A and 7B are partially enlarged plan views illustrating an input sensor according to an exemplary embodiment of the present disclosure.
Figure 7B:
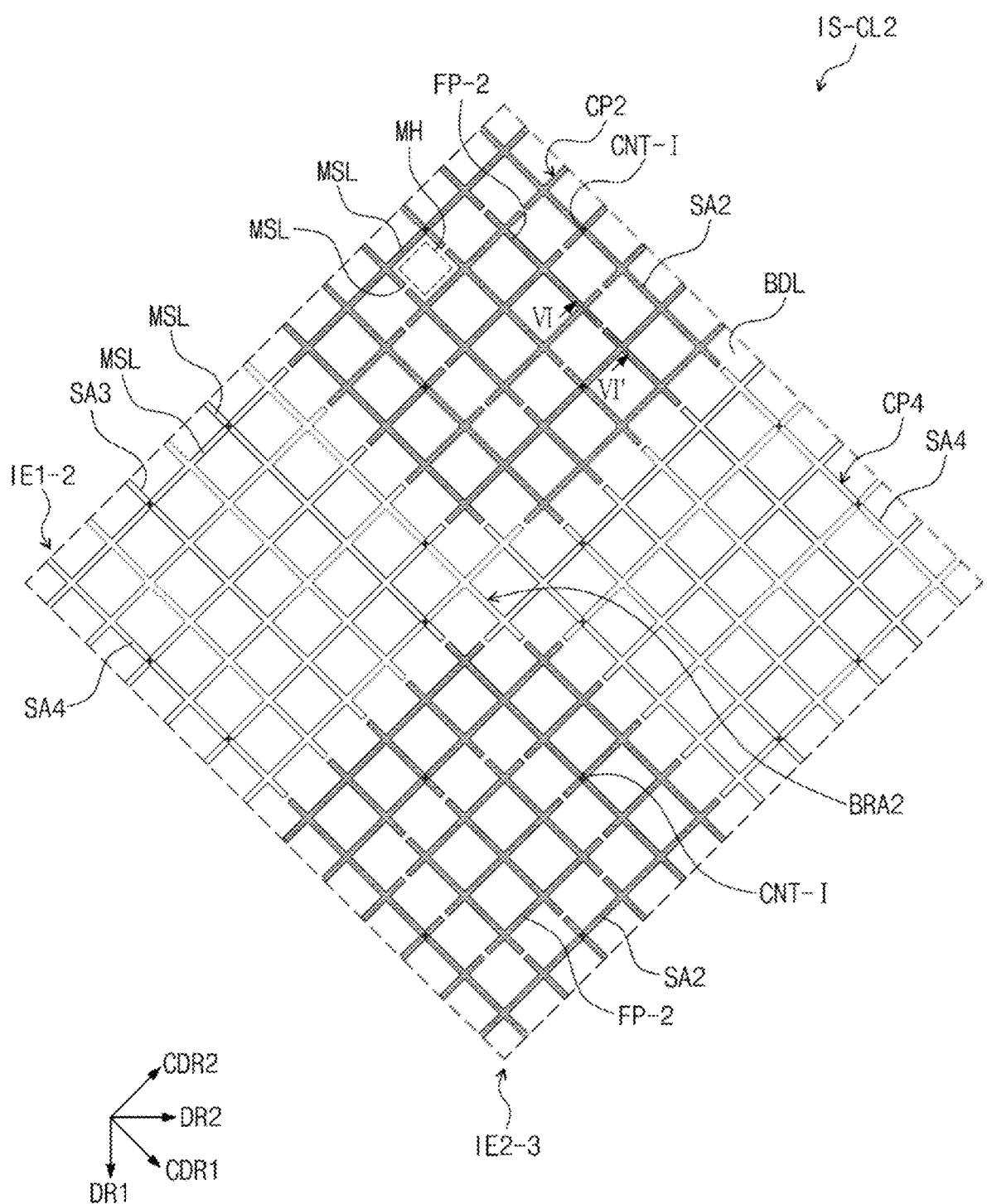

FIGS. 7A and 7B are partially enlarged plan views illustrating an input sensor according to an exemplary embodiment of the present disclosure. FIGS. 7A and 7B respectively correspond to FIGS. 5A and 5B. Hereinafter, detailed descriptions of the same elements as those described with reference to FIGS. 1 to 6D will be omitted.

An input sensing layer ISL according to the present exemplary embodiment may further include a floating electrode as compared with the input sensing layer ISL described with reference to FIGS. 5A to FIG. 5I. The floating electrode is spaced apart from and electrically separated from the first sensing electrode IE1-2 and the second sensing electrode IE2-3 illustrated in FIGS. 5A and 5B.

The floating electrode may include a plurality of floating patterns. FIG. 7A illustrates a first floating pattern FP-1 of the floating electrode disposed inside the first pattern CP1, and FIG. 7B illustrates a second floating pattern FP-2 of the floating electrode disposed inside the second pattern CP2.

Two first floating patterns FP-1 disposed inside two first sensor areas SA1 and two second floating patterns FP-2 disposed inside two second sensor areas SA2 are illustrated as a representative example. In an exemplary embodiment of the present disclosure, the floating patterns may be disposed inside the third pattern CP3 and/or the fourth pattern CP4.

A cross-section taken along line VI-VI' of FIGS. 7A and 7B may be substantially the same as that in one of FIGS. 5D to 5G. The line width, the material, the stacked structure, and the distance DT of the first and second mesh lines MSL1 and MSL2, which are described with reference to FIGS. 5D to 5G may be equally applied to the mesh line of the first floating pattern FP-1 and the mesh line of the second floating pattern FP-2. For example, the first mesh line MSL1 of the first floating pattern FP-1 and a second mesh line MSL2 of the second floating pattern FP-2 may overlap with each other. Also, the first mesh line MSL1 of the first floating pattern FP-1 and the second mesh line MSL2 of the second floating pattern FP-2 may extend along the reference direction. An edge MSL1-E of the first mesh line MSL1 of the first floating pattern FP-1 disposed in the reference direction and an edge MSL2-E of the second mesh line MSL2 of the second floating pattern FP-2 disposed in the reference direction may not be aligned with each other along a direction (i.e., the third direction DR3) perpendicular to the line width direction (i.e., the second diagonal direction CDR2) and the reference direction (i.e., the first diagonal direction CDR1).

When the edge MSL1-E of the first mesh line MSL1 of the first floating pattern FP-1 and the edge MSL2-E of the second mesh line MSL2 of the second floating pattern FP-2 are aligned, the stress is concentrated in the second insulating layer IS-IL2, and thus damage to the second insulating layer IS-IL2, such as cracking of the inorganic layer may occur. As the edge MSL1-E of the first mesh line MSL1 and the edge MSL2-E of the second mesh line MSL2 are not aligned with each other, a stress applied to the second insulating layer IS-IL2 may be reduced. A distance DT between the edge MSL1-E of the first mesh line MSL1 and the edge MSL2-E of the second mesh line MSL2 in the first diagonal direction CDR1 may be larger than the process error W-E described with reference to FIG. 5H, and may be in a range from about 1.5 µm to about 5 µm. Therefore, the second insulating layer IS-IL2 may be prevented from being damaged. For example, the display device DD may thus be resistant to cracking during bending and handling.

The first boundary distance DT-B1 described with reference to FIGS. 5D to 5G may be equally applied between the mesh line of the first pattern CP1 and the mesh line of the first floating pattern FP-1, and the second boundary distance DT-B2 described with reference to FIGS. 5D to 5G may be equally applied between the mesh line of the second pattern CP2 and the mesh line of the second floating pattern FP-2.

Figure 8A:
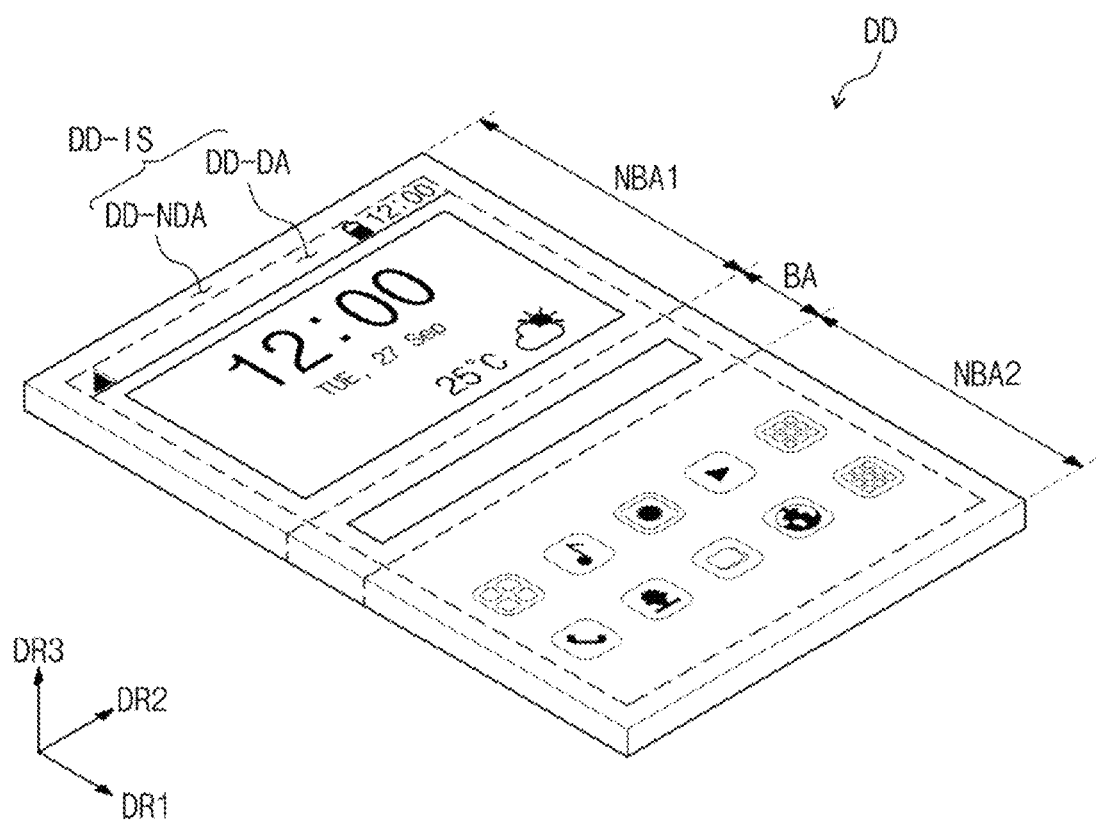
FIGS. 8A to 8C are perspective views illustrating a display device according to an exemplary embodiment of the present disclosure.
Figure 8B:
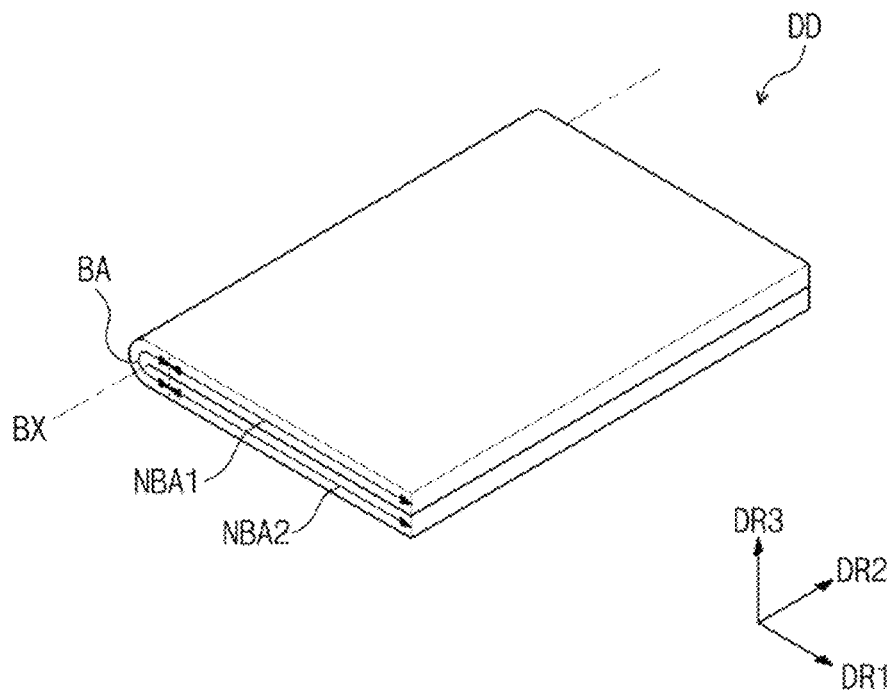
Figure 8C:
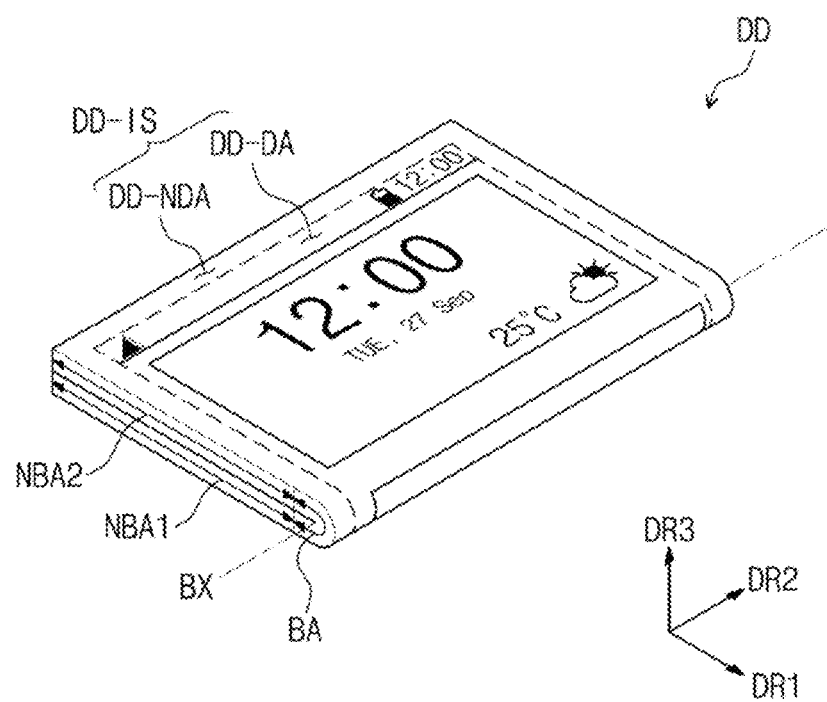

FIGS. 8A to 8C are perspective views illustrating a display device DD according to an exemplary embodiment of the present disclosure. The input sensor described with reference to FIGS. 1 to 7B may be applied to the display device DD.

As illustrated in FIGS. 8A to 8C, the display device DD may include a plurality of areas defined depending on its operation mode. The display device DD may include a first area NBA1, a second area NBA2, and a third area BA disposed between the first area NBA1 and the second area NBA2. The third area BA is bent on the basis of a bending axis BX to substantially form a curvature. Hereinafter, the first area NBA1, the second area NBA2, and the third area BA may be respectively referred to as a first non-bending area NBA1, a second non-bending area NBA2, and a bending area BA.

As illustrated in FIG. 8B, the display device DD may be inwardly bent (inner-bending) such that a display surface DD-IS of the first non-bending area NBA1 faces a display surface DD-IS of the second non-bending area NBA2. As illustrated in FIG. 8C, the display device DD may be outwardly bent (outer-bending) such that the display surface DD-IS is exposed to the outside.

The display device DD according to an exemplary embodiment of the present disclosure may include a plurality of bending areas BA. In addition, the bending areas BA may be defined corresponding to a manner in which a user operates the display device DD. For instance, different from FIGS. 8B and 8C, the bending area BA may be defined to be substantially parallel to the first directional axis DR1 or may be defined in a diagonal direction. The bending area BA may have a size determined depending on a radius of curvature without being fixed.

In an exemplary embodiment of the present disclosure, the display device DD may repeat only the operation mode illustrated in FIGS. 8A and 8B or may repeat only the operation mode illustrated in FIGS. 8A and 8C.

The input sensor described with reference to FIGS. 5A to 7C may be applied to the foldable display device illustrated in FIGS. 8A to 8C. The crack occurring in the inorganic layer of the bending area BA may be reduced.

Although the exemplary embodiments of the present disclosure have been described, it is understood that the present disclosure should not be limited to these exemplary embodiments but various changes and modifications can be made by one ordinary skilled in the art without departing from the spirit and scope of the present disclosure as hereinafter claimed.

Therefore, the disclosed subject matter should not be limited to any single exemplary embodiment described herein, and the scope of the present inventive concept shall be determined according to the appended claims.

What is claimed is:

1. A display device comprising:
a display panel providing a base surface; and
an input sensor disposed on the base surface, the input sensor comprising:
an intermediate insulating layer;
a first sensing electrode; and
a second sensing electrode insulated from the first sensing electrode while crossing the first sensing electrode, the first sensing electrode comprising:
a first pattern comprising mesh lines; and
a second pattern overlapping with the first pattern with the intermediate insulating layer interposed therebetween, connected to the first pattern via a contact hole defined through the intermediate insulating layer, and comprising mesh lines,
wherein the mesh lines of the first pattern comprise a first mesh line extending in a reference direction,
the mesh lines of the second pattern comprise a second mesh line extending in the reference direction and overlapping with the first mesh line,
an edge of the first mesh line and an edge of the second mesh line are not aligned with each other in a direction normal to the base surface, and
a distance between the edge of the first mesh line and the edge of the second mesh line in the reference direction is greater than a distance between the edge of the first mesh line and the edge of the second mesh line in a line width direction perpendicular to the reference direction.

2. The display device of claim 1, wherein a distance between the edge of the first mesh line and the edge of the second mesh line in the reference direction is in a range from about 1.5 µm to about 5 µm.

3. The display device of claim 1, wherein a line width of the first mesh line and a line width of the second mesh line are substantially the same as each other.

4. The display device of claim 1, wherein the second sensing electrode comprises:
a third pattern comprising mesh lines, disposed on a layer the same as that of the first pattern, and spaced apart from the first pattern; and
a fourth pattern disposed on a layer the same as that of the second pattern, spaced apart from the second pattern, overlapping with the third pattern, connected to the third pattern via a contact hole defined through the intermediate insulating layer, and comprising mesh lines.

5. The display device of claim 4, wherein the first pattern comprises first sensor areas and a first bridge area connecting the first sensor areas, and the second pattern comprises second sensor areas overlapping with the first sensor areas.

6. The display device of claim 5, wherein the third pattern comprises third sensor areas and a dummy area spaced apart from the third sensor areas,
the fourth pattern comprises fourth sensor areas overlapping with the third sensor areas and the first bridge area, and a second bridge area connecting the fourth sensor areas and overlapping with the dummy area,
a direction in which the first sensor areas are arranged is the same as a direction in which the second sensor areas are arranged,
a direction in which the third sensor areas are arranged is the same as a direction in which the fourth sensor areas are arranged, and
the direction in which the first sensor areas are arranged crosses the direction in which the third sensor areas are arranged.

7. The display device of claim 6, wherein the fourth sensor areas have a size greater than a size of the third sensor areas.

8. The display device of claim 4, wherein the mesh lines of the third pattern comprise a third mesh line extending along the reference direction, and
a distance between the edge of the first mesh line and an edge of the third mesh line in the reference direction is in a range from about 1 µm to about 5 µm or in a range from about 6 µm to about 15 µm.

9. The display device of claim 1, wherein the intermediate insulating layer comprises a silicon oxide layer, a silicon nitride layer, or a silicon oxynitride layer.

10. The display device of claim 1, wherein the input sensor is directly disposed on the base surface.

11. The display device of claim 1, wherein the input sensor further comprises:
a lower insulating layer disposed under the intermediate insulating layer and supporting the first pattern; and
an upper insulating layer covering the second pattern and disposed on the intermediate insulating layer,
wherein the lower insulating layer and the intermediate insulating layer each comprises an inorganic layer, and
the upper insulating layer comprises an organic layer.

12. An input sensor comprising:
a first mesh pattern;
an insulating layer covering the first mesh pattern;
a second mesh pattern disposed on the insulating layer,
wherein the first mesh pattern comprises a first sensing area and a second sensing area, which are separated from each other when viewed in a plan view,
the second mesh pattern comprises a third sensing area and a fourth sensing area, which are separated from each other when viewed in the plan view,
mesh lines arranged in the first sensing area overlap with mesh lines arranged in the third sensing area,
mesh lines arranged in the second sensing area overlap with mesh lines arranged in the fourth sensing area,
a first boundary distance between ends of the mesh lines arranged in the first sensing area and ends of the mesh lines arranged in the second sensing area is different from a second boundary distance between ends of the mesh lines arranged in the third sensing area and ends of the mesh lines arranged in the fourth sensing area, and
an end side surface and two side surfaces directly connected to the end side surface at each of the ends of the mesh lines arranged in the first sensing area are exposed to the insulating layer.

13. The input sensor of claim 12, wherein one of the first boundary distance and the second boundary distance is greater than an other one of the first boundary distance and the second boundary distance by about 3 µm to about 10 µm.

14. The input sensor of claim 12, wherein the mesh lines arranged in the first sensing area comprise a first mesh line extending along a reference direction, the mesh lines arranged in the third sensing area comprise a second mesh line extending along the reference direction and overlapping with the first mesh line, and an edge of the first mesh line and an edge of the second mesh line are not aligned with each other along a direction perpendicular to a line width direction and the reference direction.

15. The input sensor of claim 14, wherein a distance between the edge of the first mesh line and the edge of the second mesh line in the reference direction is in a range from about 1.5 μm to about 5 μm.

16. The input sensor of claim 14, wherein a distance between the edge of the first mesh line and the edge of the second mesh line in the reference direction is greater than a distance between the edge of the first mesh line and the edge of the second mesh line in the line width direction perpendicular to the reference direction.

17. A display device comprising:
a display panel; and
an input sensor disposed on the display panel, the input sensor comprising:
    an intermediate insulating layer;
    a sensing electrode; and
    a floating electrode disposed inside, spaced apart from and electrically separated from the sensing electrode, the floating electrode comprising:
        a first floating pattern comprising mesh lines; and
        a second floating pattern overlapping with the first floating pattern with the intermediate insulating layer disposed therebetween and comprising mesh lines,
        wherein the mesh lines of the first floating pattern comprise a first mesh line extending in a reference direction,
        the mesh lines of the second floating pattern comprise a second mesh line extending in the reference direction and overlapping with the first mesh line, and
        an edge of the first mesh line and an edge of the second mesh line are not aligned with each other along a direction perpendicular to a line width direction and the reference direction.

18. The display device of claim 17, wherein the sensing electrode comprises:

a first pattern comprising mesh lines and disposed on a layer the same as that of the first floating pattern; and
a second pattern disposed on a layer the same as that of the second floating pattern, overlapping with the first pattern, connected to the first pattern via a contact hole defined through the intermediate insulating layer, and comprising mesh lines.

19. The display device of claim 17, wherein a distance between the edge of the first mesh line and the edge of the second mesh line in the reference direction is greater than a distance between the edge of the first mesh line and the edge of the second mesh line in the line width direction perpendicular to the reference direction.

20. An input sensor comprising:
an intermediate insulating layer;
a first sensing electrode; and
a second sensing electrode separated from the first sensing electrode along a boundary line and crossing the first sensing electrode, the first sensing electrode comprising:
    a first pattern comprising mesh lines which comprise a first mesh line extending in a reference direction; and
    a second pattern overlapping with the first pattern with the intermediate insulating layer interposed therebetween, connected to the first pattern via a contact hole defined through the intermediate insulating layer, and comprising mesh lines which comprise a second mesh line extending in the reference direction and overlapping with the first mesh line,
    wherein the first mesh line and the second mesh line together form a step structure or an overhang structure in the reference direction around the boundary line, and
    an end side surface and two side surfaces directly connected to the end side surface of the first mesh line around the boundary line are exposed to the intermediate insulating layer.

21. The input sensor of claim 20, wherein a length of a step portion of the first mesh line not overlapping the second mesh line measured in the reference direction or a length of an overhang portion of the second mesh line not overlapping the first mesh line measured in the reference direction is in a range from about 1.5 μm to about 5 μm, and is larger than a range of a normal process error.

* * * * *